(12) United States Patent
Ishiji et al.

(10) Patent No.: US 11,294,279 B2
(45) Date of Patent: Apr. 5, 2022

(54) LITHOGRAPHIC PRINTING PLATE PRECURSOR, AND METHOD FOR PRODUCING LITHOGRAPHIC PRINTING PLATE

(71) Applicant: FUJIFILM Corporation, Tokyo (JP)

(72) Inventors: Yohei Ishiji, Shizuoka (JP); Keisuke Nogoshi, Shizuoka (JP); Takeshi Inasaki, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 16/599,394

(22) Filed: Oct. 11, 2019

(65) Prior Publication Data

US 2020/0041899 A1  Feb. 6, 2020

Related U.S. Application Data

(63) Continuation of application No. PCT/JP2018/026239, filed on Jul. 11, 2018.

(30) Foreign Application Priority Data

Jul. 13, 2017 (JP) .............................. JP2017-137249

(51) Int. Cl.
*G03F 7/32* (2006.01)
*G03F 7/027* (2006.01)
*B41C 1/10* (2006.01)

(52) U.S. Cl.
CPC ............ *G03F 7/027* (2013.01); *B41C 1/1041* (2013.01); *B41C 2201/10* (2013.01)

(58) Field of Classification Search
CPC ......................................................... G03F 7/30
See application file for complete search history.

(56) References Cited

U.S. PATENT DOCUMENTS

| | | | |
|---|---|---|---|
| 4,038,257 A | 7/1977 | Suzuki et al. | |
| 2005/0271976 A1 | 12/2005 | Kakino et al. | |
| 2006/0024612 A1 | 2/2006 | Oshima et al. | |
| 2007/0072119 A1* | 3/2007 | Iwai ...................... | B41C 1/1008 430/270.1 |
| 2007/0082291 A1 | 4/2007 | Kakino et al. | |
| 2009/0047599 A1* | 2/2009 | Horne ................... | G03F 7/3035 430/281.1 |
| 2010/0274023 A1 | 10/2010 | Gallant et al. | |
| 2013/0011791 A1 | 1/2013 | Suzuki et al. | |
| 2013/0052582 A1 | 2/2013 | Hayashi | |
| 2015/0000544 A1* | 1/2015 | Shiraki ................ | C09D 11/106 101/451 |
| 2017/0123315 A1* | 5/2017 | Mizuno ................ | B41M 5/3333 |
| 2019/0329545 A1* | 10/2019 | Shibamoto ............ | C08F 220/28 |

FOREIGN PATENT DOCUMENTS

| | | |
|---|---|---|
| CN | 1372166 A | 10/2002 |
| CN | 1597313 A | 3/2005 |
| CN | 101952247 A | 1/2011 |
| CN | 102812402 A | 12/2012 |
| CN | 104203588 A | 12/2014 |
| EP | 1223196 A2 * 7/2002 | ......... C09B 23/0066 |
| EP | 1464486 A2 | 10/2004 |
| EP | 1584485 A2 | 10/2005 |
| EP | 1637324 A2 | 3/2006 |
| EP | 2072570 A1 | 6/2009 |

(Continued)

OTHER PUBLICATIONS

International Search Report for PCT/JP2018/026239 dated Sep. 18, 2018 [PCT/ISA/210].

(Continued)

*Primary Examiner* — Chanceity N Robinson

(74) *Attorney, Agent, or Firm* — Sughrue Mion, PLLC

(57) ABSTRACT

A lithographic printing plate precursor including an image recording layer on a hydrophilic support, in which the image recording layer includes a polymerization initiator, an infrared absorbent, a polymerizable compound, and an acid color former, and the infrared absorbent includes a compound represented by Formula 1, as well as a method of preparing a lithographic printing plate by use of the lithographic printing plate precursor. In Formula 1, at least one of $Ar_1$ or $Ar_2$ has a group represented by —X, where X represents a halogen atom, —C(=O)—$X_2$—$R_{11}$, —C(=O)—$NR_{12}R_{13}$, —O—C(=O)—$R_{14}$, —CN, —$SO_2N_{15}R_{16}$, or a perfluoroalkyl group, $X_2$ represents a single bond or an oxygen atom, $R_{11}$ and $R_{14}$ each independently represents an alkyl group or an aryl group, and $R_{12}$, $R_{13}$, $R_{15}$ and $R_{16}$ each independently represents a hydrogen atom, an alkyl group, or an aryl group:

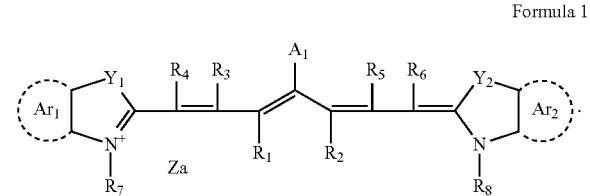

Formula 1

19 Claims, No Drawings

(56) References Cited

FOREIGN PATENT DOCUMENTS

| | | |
|---|---|---|
| ER | 1223196 A2 | 7/2002 |
| JP | 51-37193 A | 3/1976 |
| JP | 2006-096027 A | 4/2006 |
| JP | 2006-117629 A | 5/2006 |
| JP | 2006-205397 A | 8/2006 |
| JP | 2007-118587 A | 5/2007 |
| JP | 2011-213114 A | 10/2011 |
| WO | 2009/023112 A1 | 2/2009 |
| WO | 2013145949 A1 | 10/2013 |
| WO | WO-2018092661 A * 5/2018 ........... B41C 1/1008 |

OTHER PUBLICATIONS

Written Opinion of the International Searching Authority for PCT/JP2018/026239 dated Sep. 10, 2018 [PCT/ISA/237].

The International Preliminary Report of Patentability for PCT/JP2018/026239 dated Feb. 1, 2019 [PCT/IPEA/409].

Communication dated Mar. 3, 2020, from The State Intellectual Property Office of the P.R. of China in Application No. 201880024688.3.

Communication dated Apr. 28, 2020, from the European Patent Office in European Application No. 18831925.5.

Office Action dated Aug. 27, 2020, from the State Intellectual Property Office of the P.R.C. in Chinese application No. 201880024688.3.

Office Action dated Dec. 22, 2020, issued by the State Intellectual Property Office of the People's Republic of China in Chinese application No. 201880024688.3.

Office Action dated Apr. 30, 2021 by the Chinese Patent Office in Chinese Application No. 201880024688.3.

* cited by examiner

LITHOGRAPHIC PRINTING PLATE PRECURSOR, AND METHOD FOR PRODUCING LITHOGRAPHIC PRINTING PLATE

CROSS-REFERENCE TO RELATED APPLICATIONS

This application is a Continuation of International Application No. PCT/JP2018/026239 filed on Jul. 11, 2018, which claims priority to Japanese Patent Application No. 2017-137249 filed on Jul. 13, 2017. The entire contents of these applications are incorporated herein by reference.

BACKGROUND OF THE INVENTION

Technical Field

The present disclosure relates to a lithographic printing plate precursor and a method of preparing a lithographic printing plate.

Background Art

In general, lithographic printing plates include lipophilic image areas for receiving ink and hydrophilic non-image areas for receiving dampening water during printing. Lithographic printing means methods including allowing lithographic printing plates to have lipophilic image areas serving as ink-receiving areas and hydrophilic non-image areas serving as dampening water-receiving areas (ink non-receiving areas) by means of the property of repelling each other between water and oil-based ink, to thereby result in the difference in adhesiveness of ink onto the surface of the lithographic printing plates, applying ink onto only the image areas, and thereafter transferring the ink to printing sheets, such as paper, for printing.

Lithographic printing plate precursors (PS plates) obtained by providing lipophilic photosensitive resin layers (image recording layers) on hydrophilic supports have been conventionally widely used in order to prepare such lithographic printing plates. Such lithographic printing plates are usually obtained by exposing lithographic printing plate precursors through original drawings such as lithographic films, thereafter allowing portions serving as image areas of image recording layers to remain and removing other unrequired image recording layers with dissolution in alkaline developers or organic solvents, thereby exposing the surface of hydrophilic supports to form non-image areas.

Environmental challenges about waste liquids associated with wet treatments such as developing treatments have been highlighted with an increased interest in global environment.

There has been demanded, in response to the environmental challenges, to simplify or eliminate developing and/or plate making. One simple preparation method being performed is a method so-called "on-press development". That is, such a method corresponds to a method where a lithographic printing plate precursor is exposed and then mounted to a printer as it is without any conventional development, thereby allowing an unrequired portion of an image recording layer to be removed at the initial state of a usual printing step.

Examples of a conventional lithographic printing plate precursor include a lithographic printing plate precursor described in U.S. Patent No. 2009/0047599 or U.S. Patent No. 2013/0052582.

SUMMARY OF INVENTION

Technical Problem

A lithographic printing plate being demanded is a lithographic printing plate excellent in terms of the number of sheets on which printing can be made by the plate (hereinafter, also referred to as "printing durability").

The present inventors have made intensive studies, and as a result, have found that the lithographic printing plate precursor described in U.S. Patent No. 2009/0047599 or U.S. Patent No. 2013/0052582 has the problems of being insufficient in the printing durability of a lithographic printing plate to be obtained and of being also insufficient in color development on an exposed portion.

An object to be accomplished by an embodiment of the present invention is to provide a lithographic printing plate precursor that allows a lithographic printing plate excellent in printing durability to be obtained and that is excellent in color formability.

An object to be accomplished by another embodiment of the invention is to provide a method of preparing a lithographic printing plate by use of the lithographic printing plate precursor.

Solution to Problem

Solutions to solve the above problems encompass the following aspects.

<1> A lithographic printing plate precursor including an image recording layer on a hydrophilic support, wherein the image recording layer includes a polymerization initiator, an infrared absorbent, a polymerizable compound, and an acid color former, and the infrared absorbent includes a compound represented by the following Formula 1.

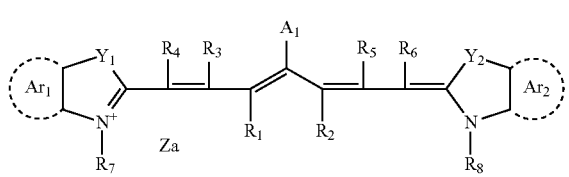

Formula 1

$R_1$ and $R_2$ each independently represent a hydrogen atom or an alkyl group, $R_1$ and $R_2$ are optionally mutually linked to form a ring, $R_3$ to $R_6$ each independently represent a hydrogen atom or an alkyl group, $R_7$ and $R_8$ each independently represent an alkyl group or an aryl group, $Y_1$ and $Y_2$ each independently represent an oxygen atom, a sulfur atom, $—NR_0—$ or a dialkylmethylene group, $Ar_1$ and $Ar_2$ each independently represent a group that forms a benzene ring or a naphthalene ring optionally having $—X$ described below, $A_1$ represents $—NR_9R_{10}$, $—X_1-L_1$, or $—X$ described below, $R_9$ and $R_{10}$ each independently represent an alkyl group, an aryl group, an alkoxycarbonyl group, or an arylsulfonyl group, $X_1$ represents an oxygen atom or a sulfur atom, $L_1$ represents a hydrocarbon group, a heteroaryl group, or a group where a bond with $X_1$ is to be cleaved by heat or infrared exposure, Za represents a counter ion that neutralizes charge, and at least one of $Ar_1$ or $Ar_2$ has a group represented by the following Formula 2.

—X                                    Formula 2

X represents a halogen atom, —C(=O)—X$_2$—R$_{11}$, —C(=O)—NR$_{12}$R$_{13}$, —O—C(=O)—R$_{14}$, —CN, —SO$_2$NR$_{15}$R$_{16}$, or a perfluoroalkyl group, X$_2$ represents a single bond or an oxygen atom, R$_{11}$ and R$_{14}$ each independently represent an alkyl group or an aryl group, and R$_{12}$, R$_{13}$, R$_{15}$ and R$_{16}$ each independently represent a hydrogen atom, an alkyl group, or an aryl group.

<2> The lithographic printing plate precursor according to <1>, wherein only one of Ar$_1$ or Ar$_2$ in Formula 1 has the group represented by Formula 2.

<3> The lithographic printing plate precursor according to <1> or <2>, wherein X in Formula 2 represents a fluorine atom, a chlorine atom, or —C(=O)OR$_{17}$, provided that R$_{17}$ represents an alkyl group or an aryl group.

<4> The lithographic printing plate precursor according to <2> or <3>, wherein A$_1$ in Formula 1 represents —NR$_{18}$R$_{19}$ or —S—R$_{20}$, provided that R$_{18}$ and R$_{19}$ each independently represent an aryl group and R$_{20}$ represents a hydrocarbon group or a heteroaryl group.

<5> The lithographic printing plate precursor according to any one of <1> to <4>, wherein the difference between the HOMO of the compound represented by Formula 1 and the HOMO of at least one compound of the polymerization initiator is 0.60 eV or less.

<6> The lithographic printing plate precursor according to any one of <1> to <5>, wherein the polymerization initiator is a borate compound.

<7> The lithographic printing plate precursor according to <6>, wherein the borate compound is a tetraarylborate compound or a monoalkyltriarylborate compound.

<8> The lithographic printing plate precursor according to any one of <1> to <7>, wherein the polymerization initiator includes an electron-donating polymerization initiator and an electron-accepting polymerization initiator.

<9> The lithographic printing plate precursor according to any one of <1> to <8>, wherein the acid color former is at least one compound selected from the group consisting of a spiropyran compound, a spirooxazine compound, a spirolactone compound, and a spirolactam compound.

<10> The lithographic printing plate precursor according to any one of <1> to <9>, wherein Za represents a carbon atom-containing organic anion.

<11> The lithographic printing plate precursor according to any one of <1> to <10>, wherein Za represents a sulfonimide anion.

<12> A method of preparing a lithographic printing plate, comprising a step of imagewise exposing the lithographic printing plate precursor according to any one of <1> to <11>, thereby forming an exposed portion and an unexposed portion, and a step of feeding at least one of printing ink or dampening water, thereby removing the unexposed portion.

Advantageous Effects of Invention

An embodiment of the invention can provide a lithographic printing plate precursor that allows a lithographic printing plate excellent in printing durability to be obtained and that is excellent in color formability.

Another embodiment of the invention can provide a method of preparing a lithographic printing plate by use of the lithographic printing plate precursor.

DESCRIPTION OF EMBODIMENTS

Hereinafter, the content of the disclosure will be described in detail. The description of constituent elements set forth below may be made based on representative embodiments of the disclosure, but the disclosure is not limited to such embodiments.

Herein, "(from) . . . to . . . " representing any numerical range is used to mean that the numerical range includes the numerical values described before and after "to" as the lower limit and the upper limit, respectively.

In a case in which a group (atomic group) is herein noted with neither substitution nor unsubstitution being mentioned, the concept thereof encompasses a group having no substituent and a group having a substituent. For example, the term "alkyl group" includes not only an alkyl group (unsubstituted alkyl group) having no substituent, but also an alkyl group (substituted alkyl group) having a substituent.

Herein, the concept of "(meth)acryl" encompasses both acryl and methacryl, and the concept of "(meth)acryloyl" encompasses both acryloyl and methacryloyl.

Herein, the term "step" includes not only an independent step, but also a step that can achieve a predetermined object even in the case of being not clearly distinguished from other steps.

In the disclosure, "% by mass" has the same definition as that of "% by weight", and "part(s) by mass" has the same definition as that of "part(s) by weight".

In the disclosure, a combination of two or more preferred aspects is a more preferred aspect The weight average molecular weight (Mw) and the number average molecular weight (Mn) in the disclosure each mean a molecular weight in conversion of polystyrene used as a standard substance, as determined with detection by a differential refractometer in a solvent THF (tetrahydrofuran) by use of a gel permeation chromatography (GPC) analyzer where columns of TSKgel GMHxL, TSKgel G4000HxL, and TSKgel G2000HxL (all are trade names, manufactured by Tosoh Corporation) are used, unless particularly noted.

The term "lithographic printing plate precursor" herein encompasses not only a lithographic printing plate precursor, but also an original plate serving as a key plate. The term "lithographic printing plate" encompasses not only a lithographic printing plate produced by, if necessary, subjecting a lithographic printing plate precursor to operations such as exposing and developing, but also a key plate. Such operations such as exposing and developing are not necessarily needed in the case of an original plate serving as a key plate. The key plate herein means, for example, a lithographic printing plate precursor to be mounted to a plate cylinder which is not used in color printing of newspaper which is to be partially printed in a single color or two colors.

Hereinafter, the disclosure will be described in detail.

(Lithographic Printing Plate Precursor)

The lithographic printing plate precursor according to the disclosure includes an image recording layer on a hydrophilic support, in which the image recording layer includes a polymerization initiator, an infrared absorbent, a polymerizable compound, and an acid color former, and the infrared absorbent includes a compound represented by the following Formula 1.

The lithographic printing plate precursor according to the disclosure can be suitably used as a lithographic printing plate precursor for on-press development.

Formula 1

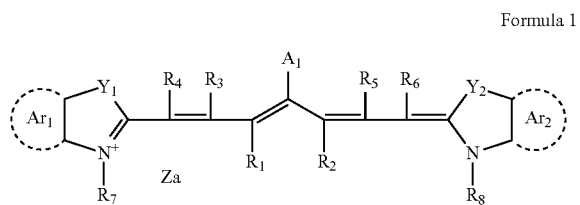

$R_1$ and $R_2$ each independently represent a hydrogen atom or an alkyl group, $R_1$ and $R_2$ are optionally mutually linked to form a ring, $R_3$ to $R_6$ each independently represent a hydrogen atom or an alkyl group, $R_7$ and $R_8$ each independently represent an alkyl group or an aryl group, $Y_1$ and $Y_2$ each independently represent an oxygen atom, a sulfur atom, —$NR_0$— or a dialkylmethylene group, $Ar_1$ and $Ar_2$ each independently represent a group that forms a benzene ring or a naphthalene ring optionally having —X described below, $A_1$ represents —$NR_9R_{10}$, —$X_1$-$L_1$, or —X described below, $R_9$ and $R_{10}$ each independently represent an alkyl group, an aryl group, an alkoxycarbonyl group, or an arylsulfonyl group, $X_1$ represents an oxygen atom or a sulfur atom, $L_1$ represents a hydrocarbon group, a heteroaryl group, or a group where a bond with $X_1$ is to be cleaved by heat or infrared exposure, Za represents a counter ion that neutralizes charge, and at least one of $Ar_1$ or $Ar_2$ has a group represented by the following Formula 2.

—X                                  Formula 2

X represents a halogen atom, —C(=O)—$X_2$—$R_{11}$, —C(=O)—$NR_{12}R_{13}$, —O—C(=O)—$R_{14}$, —CN, —$SO_2NR_{15}R_{16}$, or a perfluoroalkyl group, $X_2$ represents a single bond or an oxygen atom, $R_{11}$ and $R_{14}$ each independently represent an alkyl group or an aryl group, $R_{12}$, $R_{13}$, $R_{15}$ and $R_{16}$ each independently represent a hydrogen atom, an alkyl group, or an aryl group.

As described above, the inventors have found that a conventional lithographic printing plate precursor has the problems of being insufficient in terms of the printing durability of a lithographic printing plate to be obtained and of being also insufficient in color development on an exposed portion.

The inventors have also found that use of an infrared absorbent having an acid group, for promotion of decomposition of an acid color former, results in not only inferior printing durability, but also decomposition of a part of the acid color former even on an unexposed portion, thereby causing color development to partially occur before exposure, resulting in a small difference in color after exposure and inferior color formability.

The inventors have had intensive studies, and as a result, the above configuration can be adopted to thereby provide a lithographic printing plate precursor that allows a lithographic printing plate excellent in printing durability to be obtained and that is excellent in color formability.

The details of the mechanism where the effect is obtained are not clear, but are estimated as follows.

It is estimated that, since the compound represented by Formula 1 has a specified electron-withdrawing group —X not being an acid group, at a specified position, the HOMO (highest occupied molecular orbital) of the compound represented by Formula 1 is reduced as compared with a compound having no —X at a specified position, resulting in a reduced difference between the HOMO of the compound represented by Formula 1 and the HOMO of at least one compound of the polymerization initiator.

It is estimated that use of the compound represented by Formula 1 having a specified electron-withdrawing group —X at a specified position in combination with the polymerization initiator allows electron transfer from the polymerization initiator to the compound represented by Formula 1 to occur in exposure and decomposition of the polymerization initiator allows an acid or the like to be generated, thereby resulting in an enhancement in the rate of decomposition in exposure of the acid color former and excellent color formability. It is further estimated that the polymerization initiator includes an electron-donating polymerization initiator and an electron-accepting polymerization initiator, and the compound represented by Formula 1, a polymerizable compound and an acid color former are contained, thereby resulting in a more enhancement in printing durability.

<Image Recording Layer>

The lithographic printing plate precursor according to the disclosure includes an image recording layer containing a polymerization initiator, an infrared absorbent, a polymerizable compound, and an acid color former, in which the infrared absorbent includes a compound represented by the following Formula 1.

The image recording layer for use in the disclosure is preferably a negative type image recording layer, more preferably a water-soluble or water-dispersible, negative type image recording layer.

It is preferable from the viewpoint of on-press developability that the unexposed portion of the image recording layer is removed by at least any of dampening water or printing ink in the lithographic printing plate precursor according to the disclosure.

Hereinafter, the details of each component included in the image recording layer will be described.

—Compound Represented by Formula 1—

The image recording layer in the lithographic printing plate precursor according to the disclosure includes an infrared absorbent, and the infrared absorbent includes the compound represented by Formula 1.

The infrared absorbent has a function of converting absorbed infrared rays into heat and a function of being excited by infrared rays to thereby perform at least any of electron transfer or energy transfer to a polymerization initiator described below. The infrared absorbent for use in the disclosure is preferably a dye having a maximum absorption wavelength of from 750 nm to 1,400 nm.

$Ar_1$ and $Ar_2$ each independently represent a group that forms a benzene ring or a naphthalene ring. The benzene ring and the naphthalene ring may have any substituent other than —X. Examples of the substituent include an alkyl group, an alkoxy group, an aryloxy group, an amino group, an alkylthio group, an arylthio group, a carboxy group, a carboxylate group, a sulfo group, a sulfonate group, and a group as a combination thereof, and an alkyl group is preferable.

In Formula 1, at least one of $Ar_1$ or $Ar_2$ has the group represented by Formula 2, and only one of $Ar_1$ or $Ar_2$ preferably has the group represented by Formula 2 from the viewpoint of printing durability, color formability, and storage stability (aging stability) in aging of a coating solution for use in formation of the image recording layer.

In Formula 2, X represents a halogen atom, —C(=O)—$X_2$—$R_{11}$, —C(=O)—$NR_{12}R_{13}$, —O—C(=O)—$R_{14}$, —CN, —$SO_2NR_{15}R_{16}$, or a perfluoroalkyl group, and preferably represents a halogen atom, —C(=O)—$X_2$—$R_{11}$, —C(=O)—$NR_{12}R_{13}$, —O—C(=O)—$R_{14}$, —CN, or —$SO_2NR_{15}R_{16}$, preferably represents a halogen atom, —C(=O)—O—$R_{11}$, —C(=O)—$NR_{12}R_{13}$, or —O—C(=O)—$R_{14}$, yet more preferably represents a halogen atom, —C(=O)—O—$R_{11}$, or —O—C(=O)—$R_{14}$, particularly preferably represents a fluorine atom, a chlorine atom, or —C(=O)$OR_{17}$ from the viewpoint of printing durability, color formability, and aging stability.

$X_2$ represents a single bond or an oxygen atom, preferably represents an oxygen atom.

$R_{11}$ and $R_{14}$ preferably each independently represent an alkyl group or an aryl group, preferably represents an alkyl group having from 1 to 12 carbon atoms or an aryl group having from 6 to 12 carbon atoms, more preferably an alkyl group having from 1 to 12 carbon atom s.

$R_{12}$, $R_{13}$, $R_{15}$ and $R_{16}$ each independently represent a hydrogen atom, an alkyl group, or an aryl group, preferably a hydrogen atom, an alkyl group having from 1 to 12 carbon atoms, or an aryl group having from 6 to 12 carbon atoms, more preferably a hydrogen atom or an alkyl group having from 1 to 12 carbon atoms, yet more preferably an alkyl group having from 1 to 12 carbon atoms.

$R_{17}$ represents an alkyl group or an aryl group, preferably an alkyl group having from 1 to 12 carbon atoms or an aryl group having from 6 to 12 carbon atoms, more preferably an alkyl group having from 1 to 12 carbon atoms.

$A_1$ represents —$NR_9R_{10}$, —$X_1$-$L_1$, or —X, preferably represents —$NR_9R_{10}$ or —$X_1$-$L_1$, more preferably —$NR_{18}R_{19}$, —S—$R_{20}$ from the viewpoint of printing durability, color formability, and aging stability.

$R_9$ and $R_{10}$ each independently represent an alkyl group, an aryl group, an alkoxycarbonyl group, or an arylsulfonyl group, preferably an alkyl group having from 1 to 12 carbon atoms or an aryl group having from 6 to 12 carbon atoms, more preferably an alkyl group having from 1 to 12 carbon atoms.

$X_1$ represents an oxygen atom or a sulfur atom, and $X_1$ preferably represents a sulfur atom in a case in which $L_1$ represents a hydrocarbon group or a heteroaryl group. $L_1$ preferably represents a group where a bond with $X_1$ is to be cleaved by heat or infrared exposure.

$L_1$ represents a hydrocarbon group, a heteroaryl group, or a group where a bond with $X_1$ is to be cleaved by heat or infrared exposure, and preferably represents a hydrocarbon group or a heteroaryl group, more preferably an aryl group or a heteroaryl group, yet more preferably a heteroaryl group from the viewpoint of printing durability.

$L_1$ preferably represents a group where a bond with $X_1$ is to be cleaved by heat or infrared exposure from the viewpoint of color formability and suppression ability in aging.

The group where a bond with $X_1$ is to be cleaved by heat or infrared exposure is described below.

$R_{18}$ and $R_{19}$ each independently preferably represent an aryl group, an aryl group having from 6 to 20 carbon atoms, more preferably a phenyl group.

$R_{20}$ represents a hydrocarbon group or a heteroaryl group, preferably an aryl group or a heteroaryl group, more preferably a heteroaryl group.

Examples of each heteroaryl group in $L_1$ and $R_{20}$ preferably include the following.

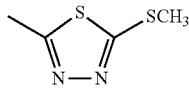

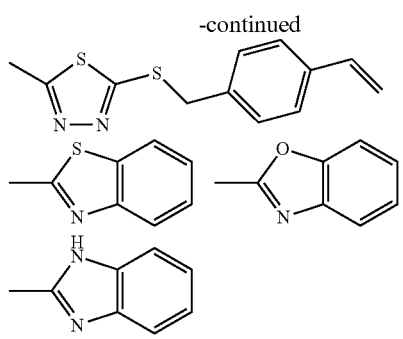

Each alkyl group in $R_1$ to $R_{10}$ and $R_0$ is preferably an alkyl group having from 1 to 30 carbon atoms, more preferably an alkyl group having from 1 to 15 carbon atoms, yet more preferably an alkyl group having from 1 to 10 carbon atoms. The alkyl group may be linear or branched, or may have a ring structure.

Specific examples include a methyl group, an ethyl group, a propyl group, a butyl group, a pentyl group, a hexyl group, a heptyl group, an octyl group, a nonyl group, a decyl group, an undecyl group, a dodecyl group, a tridecyl group, a hexadecyl group, an octadecyl group, an eicosyl group, an isopropyl group, an isobutyl group, a s-butyl group, a t-butyl group, an isopentyl group, a neopentyl group, a 1-methylbutyl group, an isohexyl group, a 2-ethylhexyl group, a 2-methylhexyl group, a cyclohexyl group, a cyclopentyl group, and a 2-norbornyl group.

Among such alkyl groups, a methyl group, an ethyl group, a propyl group or a butyl group is particularly preferable.

The alkyl group may have a substituent. Examples of the substituent include an alkoxy group, an aryloxy group, an amino group, an alkylthio group, an arylthio group, a halogen atom, a carboxy group, a carboxylate group, a sulfo group, a sulfonate group, an alkyloxycarbonyl group, an aryloxycarbonyl group, and a group as a combination thereof.

Each aryl group in $R_9$, $R_{10}$, $R_{18}$, $R_{19}$ and $R_0$ is preferably an aryl group having from 6 to 30 carbon atoms, more preferably an aryl group having from 6 to 20 carbon atoms, yet more preferably an aryl group having from 6 to 12 carbon atoms.

The aryl group may have a substituent. Examples of the substituent include an alkyl group, an alkoxy group, an aryloxy group, an amino group, an alkylthio group, an arylthio group, a halogen atom, a carboxy group, a carboxylate group, a sulfo group, a sulfonate group, an alkyloxycarbonyl group, an aryloxycarbonyl group, and a group as a combination thereof.

Specific examples of the aryl group include a phenyl group, a naphthyl group, a p-tolyl group, a p-chlorophenyl group, a p-fluorophenyl group, a p-methoxyphenyl group, a p-dimethylaminophenyl group, a p-methylthiophenyl group, and a p-phenylthiophenyl group.

Among such aryl groups, a phenyl group, a p-methoxyphenyl group, a p-dimethylaminophenyl group, or a naphthyl group is preferable.

$R_1$ and $R_2$ are preferably linked to form a ring.

In a case in which $R_1$ and $R_2$ are linked to form a ring, the number of ring members is preferably 5 or 6, more preferably 6. The ring obtained by linking $R_1$ and $R_2$ is preferably a hydrocarbon ring optionally having an ethylenically unsaturated bond.

$Y_1$ and $Y_2$ each independently represent an oxygen atom, a sulfur atom, —$NR_0$— or a dialkylmethylene group, preferably —NR$_0$— or a dialkylmethylene group, more preferably a dialkylmethylene group.

R$_0$ represents a hydrogen atom, an alkyl group, or an aryl group, preferably an alkyl group.

R$_7$ and R$_8$ preferably represent the same group.

R$_7$ and R$_8$ each independently preferably represent a linear alkyl group or an alkyl group having a sulfonate group at a terminal, more preferably a methyl group, an ethyl group, or a butyl group having a sulfonate group at a terminal.

The counter cation of the sulfonate group may be a cation on a nitrogen atom in Formula 1, or may be an alkali metal cation or an alkali earth metal cation.

R$_7$ and R$_8$ each independently preferably represent an alkyl group having an anion structure, more preferably an alkyl group having a carboxylate group or a sulfonate group, yet more preferably an alkyl group having a sulfonate group at a terminal from the viewpoint of water solubility of the compound represented by Formula 1.

R$_7$ and R$_8$ each independently preferably represent an alkyl group having an aromatic ring, more preferably an alkyl group having an aromatic ring at a terminal, particularly preferably a 2-phenylethyl group, a 2-naphthalenylethyl group, or a 2-(9-anthracenyl)ethyl group from the viewpoint of an increase in the maximum absorption wavelength of the compound represented by Formula 1, and also color formability and printing durability of the lithographic printing plate.

R$_3$ to R$_6$ each independently represent a hydrogen atom or an alkyl group, preferably a hydrogen atom.

Za represents a counter ion that neutralizes charge, and in a case in which Za represents anion species, examples include a sulfonate ion, a carboxylate ion, a tetrafluoroborate ion, a hexafluorophosphate ion, a perchlorate ion, a sulfonamide anion, and a sulfonimide anion. In a case in which Za represents cation species, Za preferably represents an alkali metal ion, an alkali earth metal ion, an ammonium ion, a pyridinium ion, or a sulfonium ion, more preferably a sodium ion, a potassium ion, an ammonium ion, a pyridinium ion, or a sulfonium ion, yet more preferably a sodium ion, a potassium ion, or an ammonium ion, particularly preferably a sodium ion, a potassium ion, or a trialkylammonium ion.

In particular, Za preferably represents a carbon atom-containing organic anion, more preferably a sulfonate ion, a carboxylate ion, a sulfonamide anion, or a sulfonimide anion, yet more preferably a sulfonamide anion or a sulfonimide anion, particularly preferably a sulfonimide anion from the viewpoint of printing durability and color formability.

R$_1$ to R$_8$, R$_0$, A$_1$, Ar$_1$, Ar$_2$, Y$_1$ and Y$_2$ may have an anion structure or a cation structure. In a case in which all R$_1$ to R$_8$, R$_0$, A$_1$, Ar$_1$, Ar$_2$, Y$_1$ and Y$_2$ represent an electrically neutral group, Za represents a monovalent counter anion, and, for example, in a case in which two or more of R$_1$ to R$_8$, R$_0$, A$_1$, Ar$_1$, Ar$_2$, Y$_1$ and Y$_2$ has an anion structure, Za can also represent a counter cation.

In a case in which any moiety other than Za in Formula 1 is electrically neutral, Za needs not be present.

The sulfonamide anion is preferably an arylsulfonamide anion.

The sulfonimide anion is preferably a bisarylsulfonimide anion.

Specific examples of the sulfonamide anion or the sulfonimide anion are shown below, but are not limited thereto in the disclosure. In the following specific examples, Ph represents a phenyl group, Me represents a methyl group, and Et represents an ethyl group, respectively.

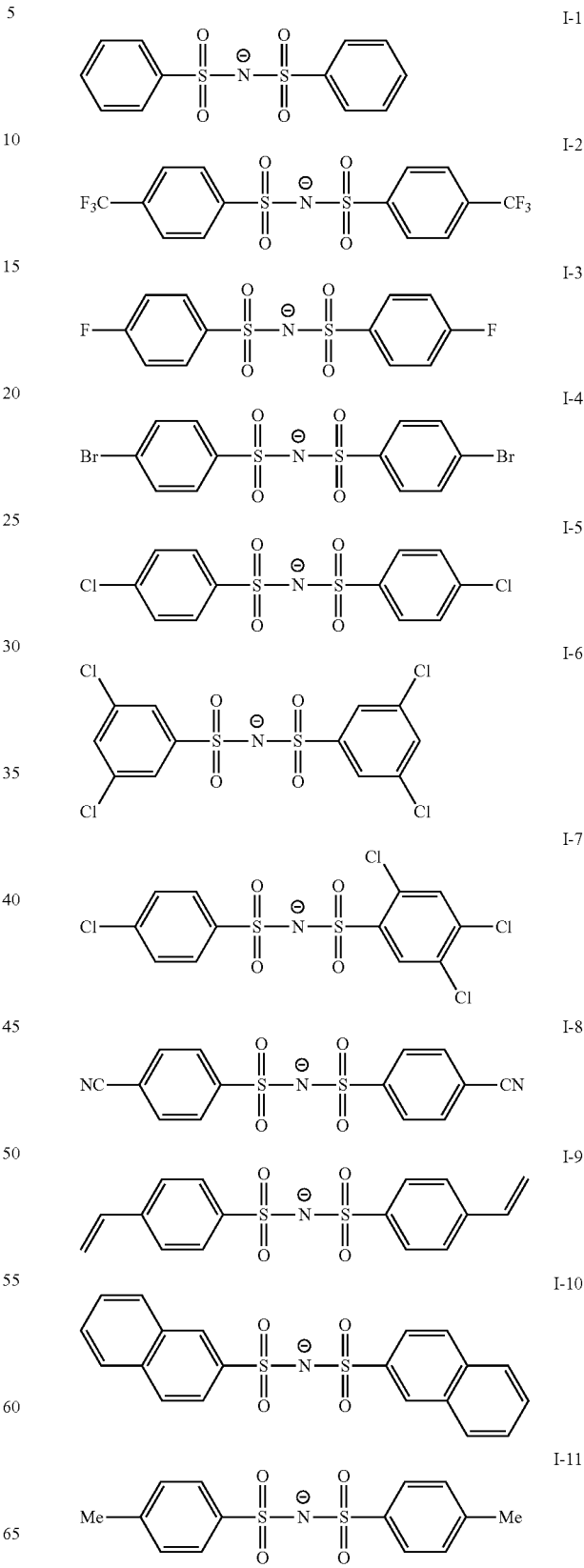

-continued
I-12 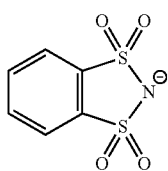
I-13 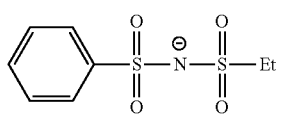
I-14 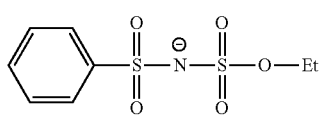
I-15 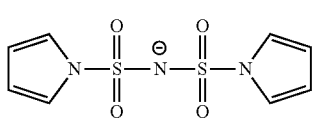
I-16 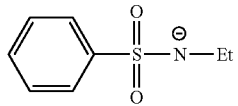
I-17 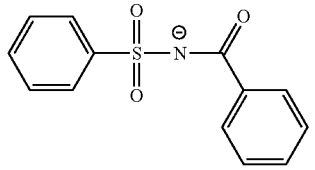
I-18 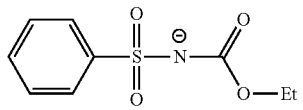
I-19 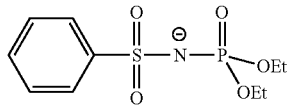
I-20 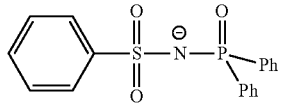
I-21 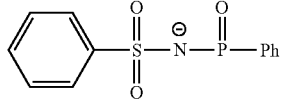
I-22 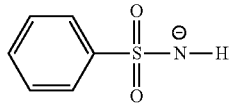
I-23 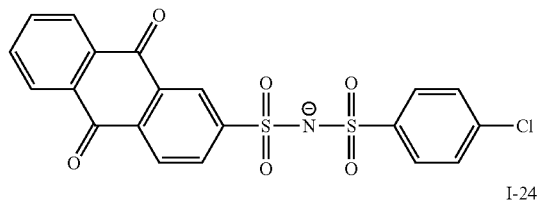
I-24 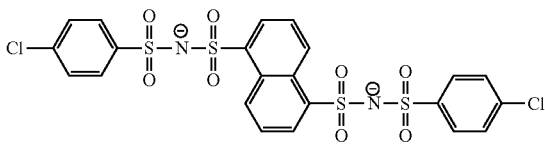
I-25 
I-26 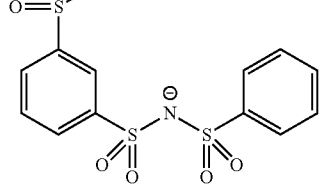
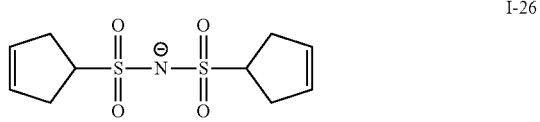
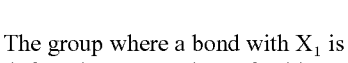
The group where a bond with $X_1$ is to be cleaved by heat or infrared exposure is preferably a group represented by any of the following Formula 1-1 to Formula 1-7, more preferably a group represented by any of the following Formula 101 to Formula 1-3 from the viewpoint of color formability.
(1-1) 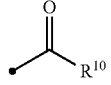
(1-2) 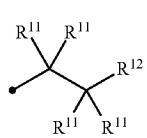
(1-3) 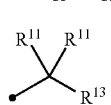
(1-4) 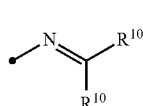
(1-5) 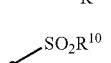
(1-6) 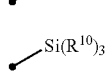

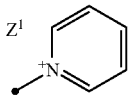
(1-7)

In Formula 1-1 to Formula 1-7, • represents a bonding site to $X_1$ in Formula 1, each $R^{10}$ independently represents a hydrogen atom, alkyl group, an alkenyl group, an aryl group, —$OR^{14}$, —$NR^{15}R^{16}$ or —$SR^{17}$, each $R^{11}$ independently represents a hydrogen atom, an alkyl group, or an aryl group, $R^{12}$ represents an aryl group, —$OR^{14}$, —$NR^{15}R^{16}$, —$SR^{17}$, —$C(=O)R^{18}$, —$OC(=O)R^{18}$, or a halogen atom, $R^{13}$ represents an aryl group, an alkenyl group, an alkoxy group, or an onium group, $R^{14}$ to $R^{17}$ each independently represent a hydrogen atom, an alkyl group, or an aryl group, each $R^{18}$ independently represents an alkyl group, an aryl group, —$OR^{14}$, —$NR^{15}R^{16}$, or —$SR^{17}$, and $Z^1$ represents a counter ion that neutralizes charge.

A preferable aspect where $R^{10}$, $R_{11}$ and $R^{14}$ to $R^{18}$ represent an alkyl group is the same as a preferable aspect of each alkyl group in $R^2$ to $R^9$ and $R^0$.

Each alkenyl group in $R^{10}$ and $R^{13}$ preferably has from 1 to 30 carbon atoms, more preferably from 1 to 15 carbon atoms, yet more preferably from 1 to 10 carbon atoms.

A preferable aspect where $R^{10}$ to $R^{18}$ represent an aryl group is the same as a preferable aspect of an aryl group in $R^0$.

$R^{10}$ in Formula 1-1 preferably represents an alkyl group, an alkenyl group, an aryl group, —$OR^{14}$, —$NR^{15}R^{16}$, or —$SR^{17}$, more preferably an alkyl group, —$OR^{14}$, —$NR^{15}R^{16}$, or —$SR^{17}$, yet more preferably an alkyl group or —$OR^{14}$, particularly preferably —$OR^{14}$ from the viewpoint of color formability.

In a case in which $R^{10}$ in Formula 1-1 represents an alkyl group, the alkyl group is preferably an alkyl group having an arylthio group or an alkyloxycarbonyl group at an α-position.

In a case in which $R^{10}$ in Formula 1-1 represents —$OR^{14}$, $R^{14}$ preferably represents an alkyl group, more preferably an alkyl group having from 1 to 8 carbon atoms, yet more preferably an isopropyl group or a t-butyl group, particularly preferably a t-butyl group.

$R^{11}$ in Formula 1-2 preferably represents a hydrogen atom from the viewpoint of color form ability.

$R^{12}$ in Formula 1-2 preferably represents —$C(=O)OR^{14}$, —$OC(=O)OR^{14}$, or a halogen atom, more preferably —$C(=O)OR^{14}$ or —$OC(=O)OR^{14}$ from the viewpoint of color formability. In a case in which $R^{12}$ in Formula 1-2 represents —$C(=O)OR^{14}$ or —$OC(=O)OR^{14}$, $R^{14}$ preferably represents an alkyl group.

Each $R^{11}$ in Formula 1-3 independently preferably represents a hydrogen atom or an alkyl group, and at least one $R^{11}$ in Formula 1-3 more preferably represents an alkyl group from the viewpoint of color formability.

The alkyl group in $R^{11}$ preferably represents an alkyl group having from 1 to 10 carbon atoms, more preferably an alkyl group having from 3 to 10 carbon atoms.

The alkyl group in $R^{11}$ preferably represents a branched alkyl group or a cycloalkyl group, more preferably a secondary or tertiary alkyl group, or a cycloalkyl group, yet more preferably an isopropyl group, a cyclopentyl group, a cyclohexyl group, or a t-butyl group.

$R^{13}$ in Formula 1-3 preferably represents an aryl group, an alkoxy group, or an onium group, more preferably a p-dimethylaminophenyl group or a pyridinium group, yet more preferably a pyridinium group from the viewpoint of color formability.

Examples of an onium group in $R^{13}$ include a pyridinium group, an ammonium group, and a sulfonium group. The onium group may have a substituent. Examples of the substituent include an alkyl group, an alkoxy group, an aryloxy group, an amino group, an alkylthio group, an arylthio group, a halogen atom, a carboxy group, a sulfo group, an alkyloxycarbonyl group, an aryloxycarbonyl group, and a group as a combination thereof, and an alkyl group, an aryl group, and a group as a combination thereof are preferable.

In particular, a pyridinium group is preferable, an N-alkyl-3-pyridinium group, an N-benzyl-3-pyridinium group, an N-(alkoxypolyalkyleneoxyalkyl)-3-pyridinium group, an N-alkoxycarbonylmethyl-3-pyridinium group, an N-alkyl-4-pyridinium group, an N-benzyl-4-pyridinium group, an N-(alkoxypolyalkyleneoxyalkyl)-4-pyridinium group, an N-alkoxycarbonylmethyl-4-pyridinium group, or an N-alkyl-3,5-dimethyl-4-pyridinium group is more preferable, an N-alkyl-3-pyridinium group or an N-alkyl-4-pyridinium group is yet more preferable, an N-methyl-3-pyridinium group, an N-octyl-3-pyridinium group, an N-methyl-4-pyridinium group or an N-octyl-4-pyridinium group is particularly preferable, an N-octyl-3-pyridinium group or an N-octyl-4-pyridinium group is most preferable.

In a case in which $R^{13}$ represents a pyridinium group, examples of the counter anion include a sulfonate ion, a carboxylate ion, a tetrafluoroborate ion, a hexafluorophosphate ion, a p-toluenesulfonate ion, and a perchlorate ion, and a p-toluenesulfonate ion or a hexafluorophosphate ion is preferable.

Each $R^{10}$ in Formula 1-4 preferably represents an alkyl group or an aryl group, and more preferably, one of two $R^{10}$'s represents an alkyl group and the other thereof represents an aryl group from the viewpoint of color formability.

$R^{10}$ in Formula 1-5 preferably represents an alkyl group or an aryl group, more preferably an aryl group, yet more preferably a p-methylphenyl group from the viewpoint of color formability.

Each $R^{10}$ in Formula 1-6 independently preferably represents an alkyl group or an aryl group, more preferably a methyl group or a phenyl group from the viewpoint of color formability.

$Z^1$ in Formula 1-7 may represent a counter ion that neutralizes charge, or may be contained in Za in terms of the entire compound from the viewpoint of color formability.

$Z^1$ preferably represents a sulfonate ion, a carboxylate ion, a tetrafluoroborate ion, a hexafluorophosphate ion, a p-toluenesulfonate ion, or a perchlorate ion, more preferably a p-toluenesulfonate ion or a hexafluorophosphate ion.

The group where a bond with $X_1$ is to be cleaved by heat or infrared exposure is particularly preferably a group represented by Formula 1-8.

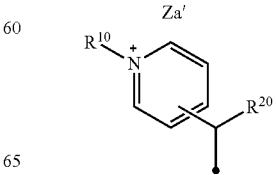
(1-8)

In Formula 1-8, • represents a bonding site to $X_1$ in Formula 1, $R^{19}$ and $R^{20}$ each independently represent an alkyl group, and Za' represents a counter ion that neutralizes charge.

The bonding position between a pyridinium ring in Formula 1-8 and a hydrocarbon group containing $R^{20}$ is preferably a 3- or 4-position on the pyridinium ring, more preferably a 4-position on the pyridinium ring.

Each alkyl group in $R^{19}$ and $R^{20}$ may be linear or branched, or may have a ring structure.

The alkyl group may have a substituent, and examples of the substituent preferably include an alkoxy group and a terminal alkoxy polyalkyleneoxy group.

$R^{19}$ preferably represents an alkyl group having from 1 to 12 carbon atoms, more preferably a linear alkyl group having from 1 to 12 carbon atoms, yet more preferably a linear alkyl group having from 1 to 8 carbon atoms, particularly preferably a methyl group or a n-octyl group.

$R^{20}$ preferably represents an alkyl group having from 1 to 8 carbon atoms, more preferably a branched alkyl group having from 3 to 8 carbon atoms, yet more preferably an isopropyl group or a t-butyl group, particularly preferably an isopropyl group.

Za' may represent a counter ion that neutralizes charge, or may be contained in Za in terms of the entire compound.

Za' preferably represents a sulfonate ion, a carboxylate ion, a tetrafluoroborate ion, a hexafluorophosphate ion, a p-toluenesulfonate ion, or a perchlorate ion, more preferably a p-toluenesulfonate ion or a hexafluorophosphate ion.

Specific examples of the compound represented by Formula 1 preferably include mother nucleus structures A-1 to A-54, counter anions B-1 to B-10, and counter cations C-1 to C-3 below, but are not limited thereto in the invention. Specific examples of the compound represented by Formula 1 include a compound obtained by combining one of mother nucleus structures A-1 to A-9, A-11 to A-20 and A-22 to A-54 with one of counter anions B-1 to B-10, and a compound obtained by combining one of mother nucleus structures A-10 and A-21 with one of counter cations C-1 to C-3.

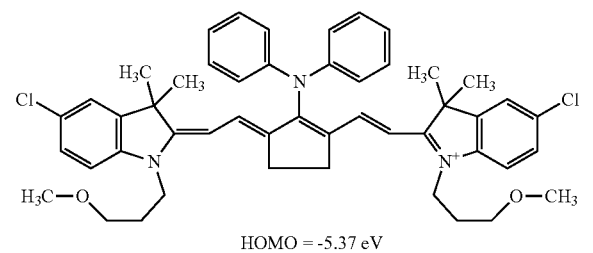

A-9
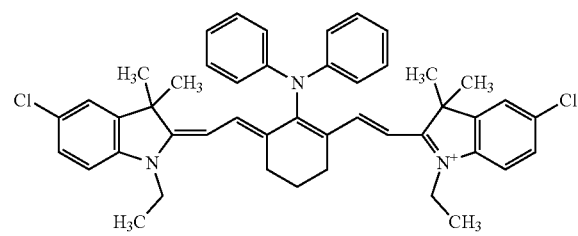
A-15
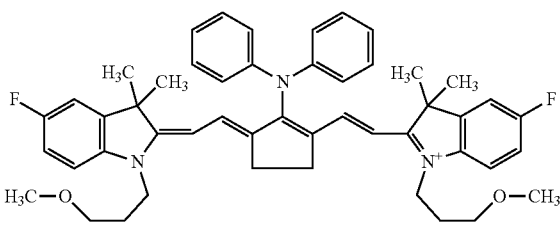
HOMO = -5.33 eV
A-10
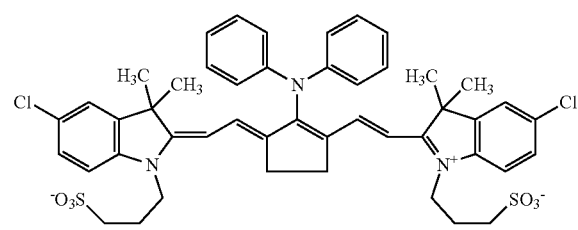
A-16
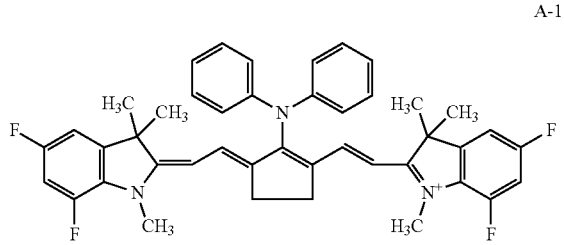
A-11
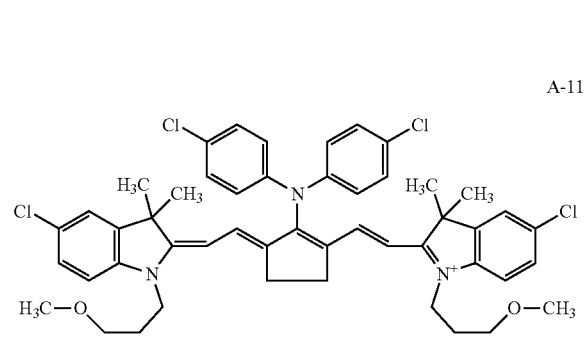
A-17
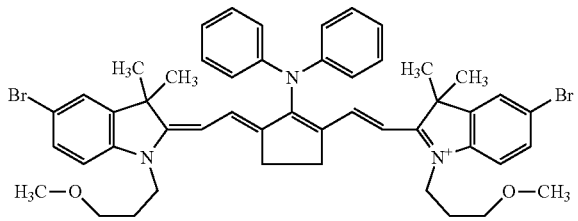
A-12
A-18
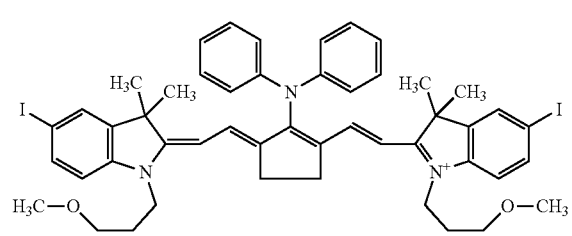
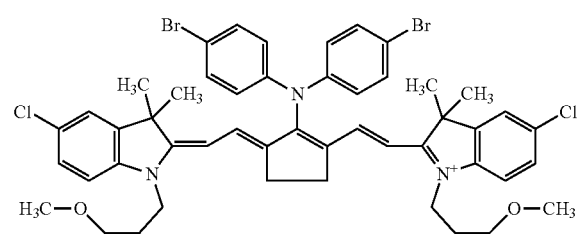
A-13
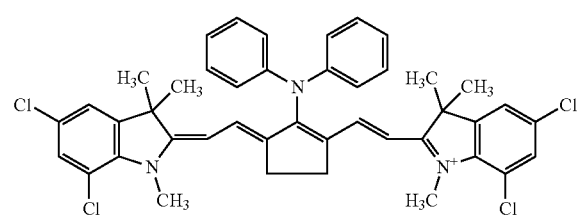
HOMO = -5.45 eV
A-19
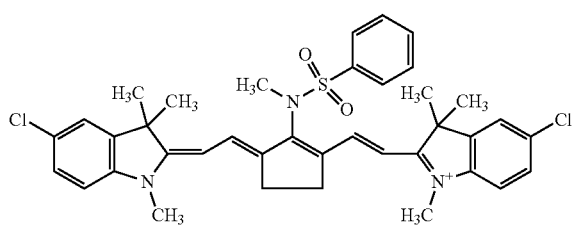
A-14
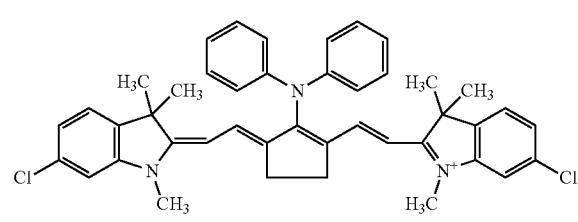
A-20
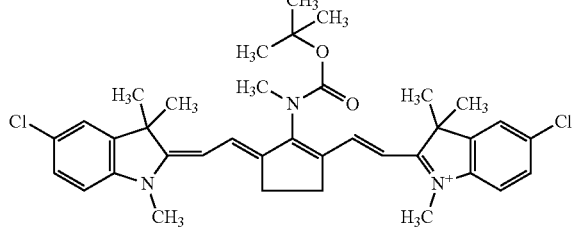

-continued
A-21
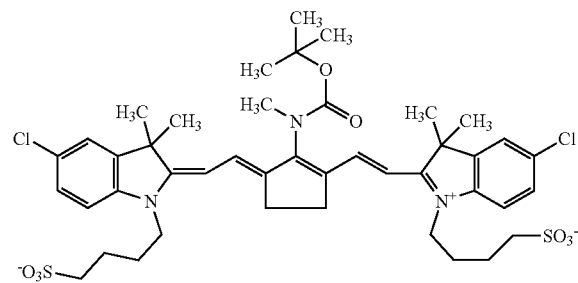
A-22
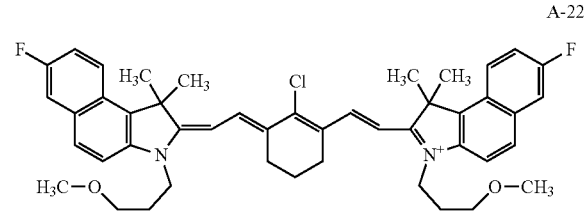
A-23
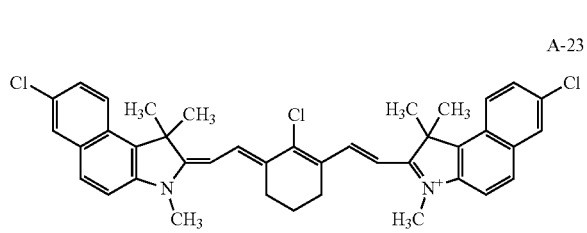
A-24
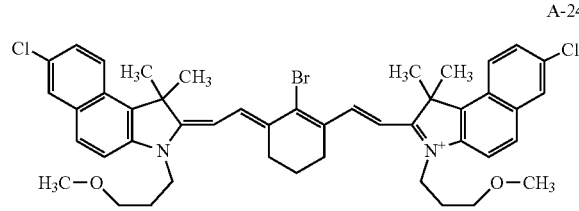
A-25
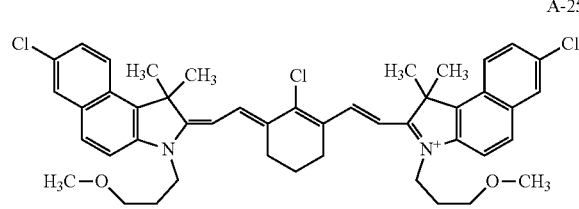
A-26
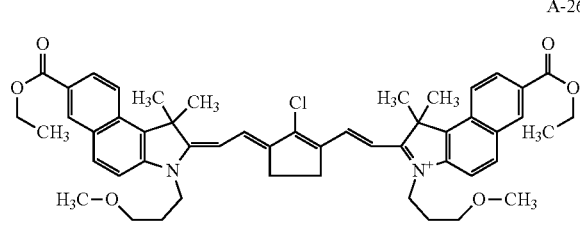
A-27
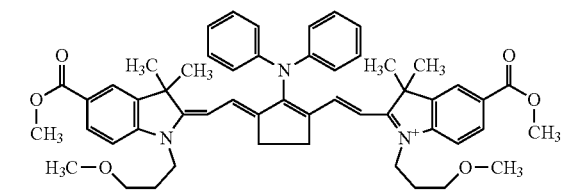
-continued
A-28
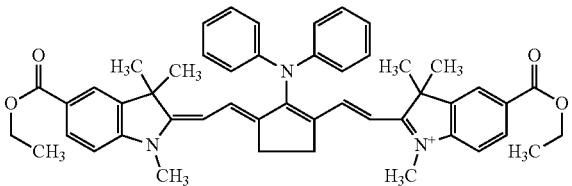
A-29
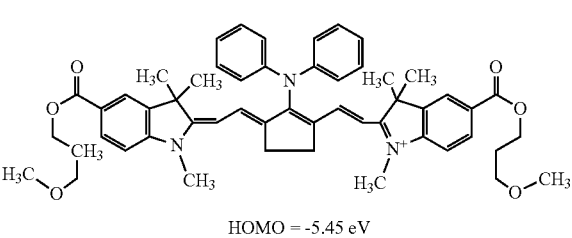
HOMO = −5.45 eV
A-30
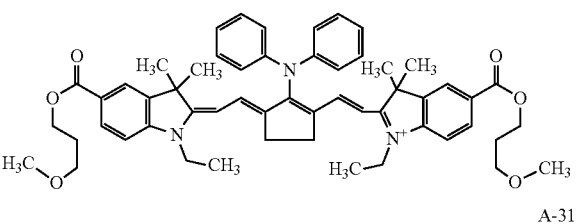
A-31
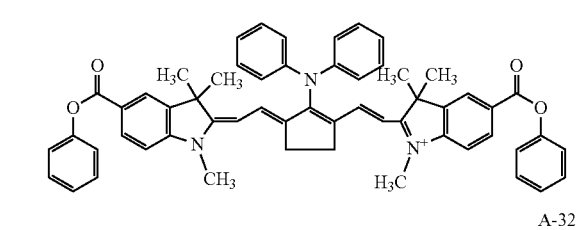
A-32
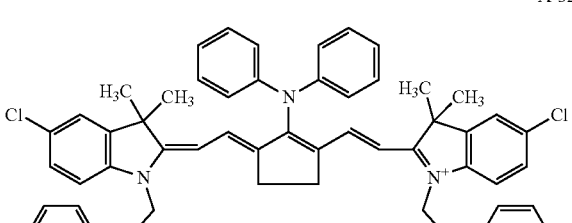
A-33
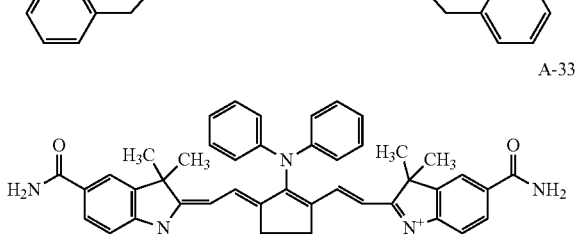
A-34
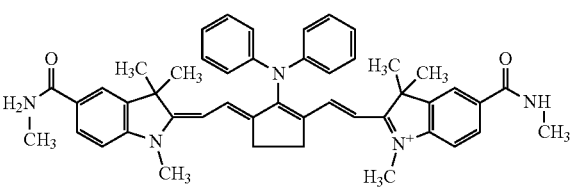

A-35
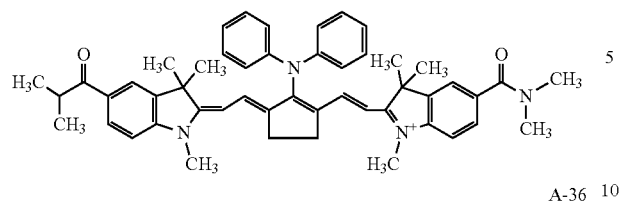
A-36
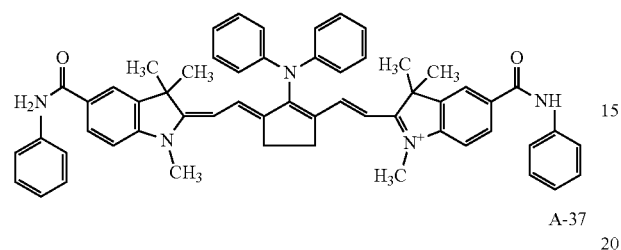
A-37
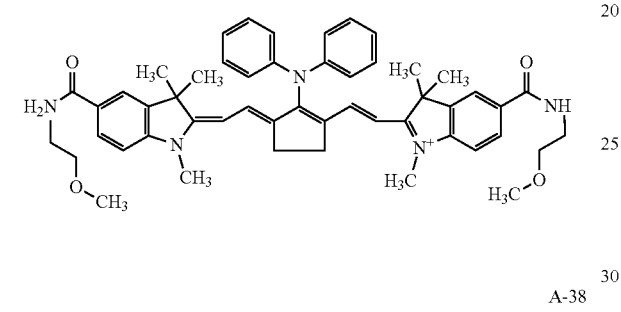
A-38
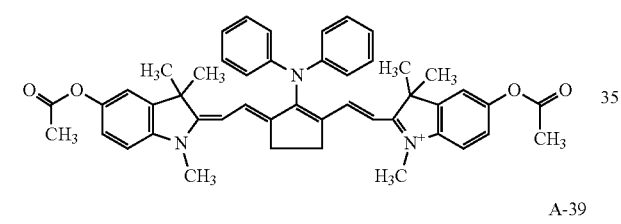
A-39
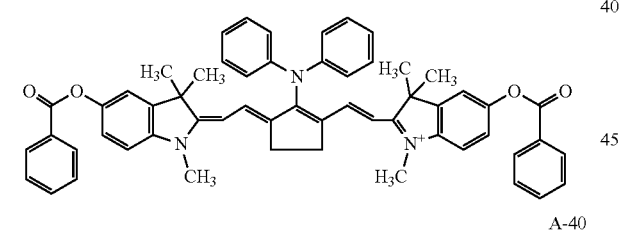
A-40
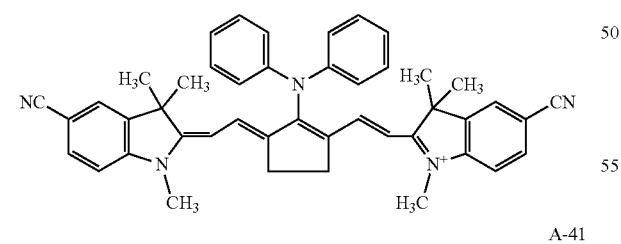
A-41
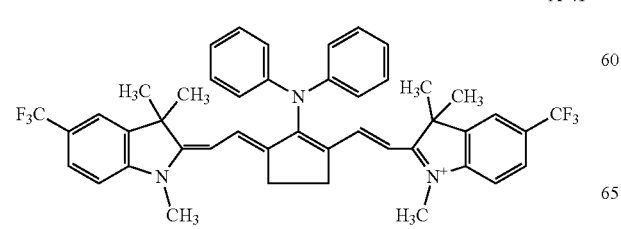
A-42
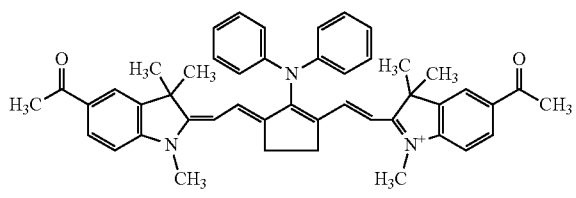
A-43
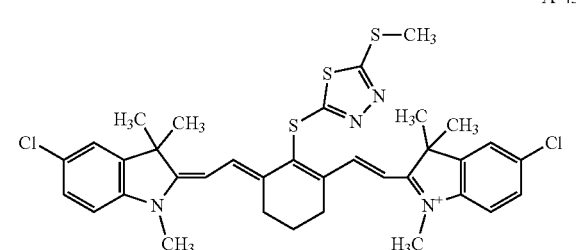
A-44
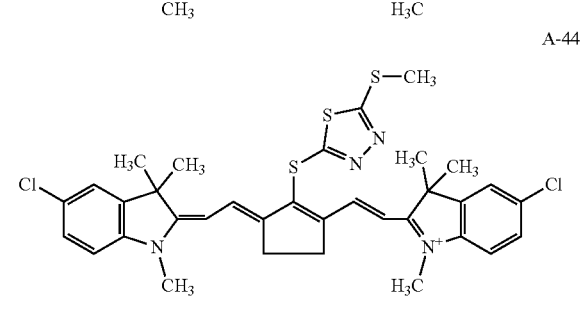
A-45
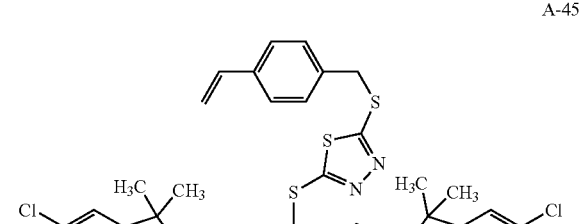
A-46
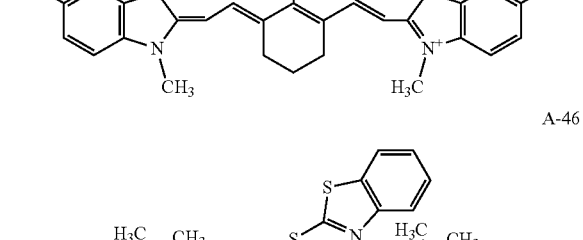
A-47
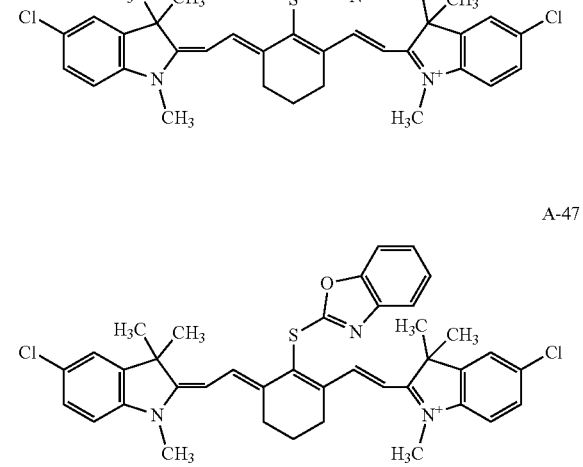

A-48
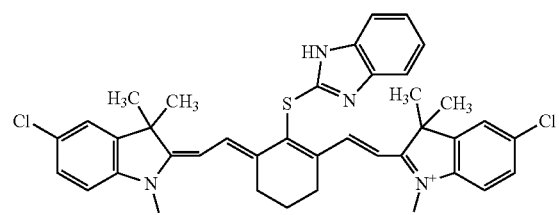
A-49
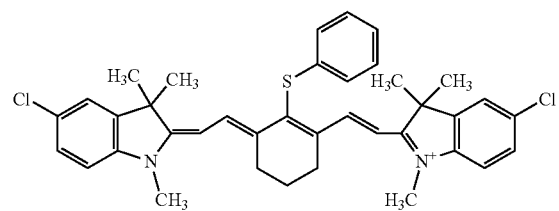
A-50
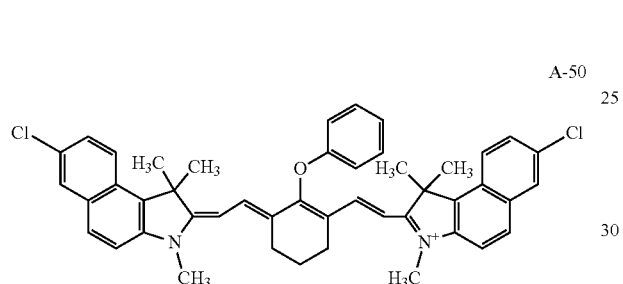
A-51
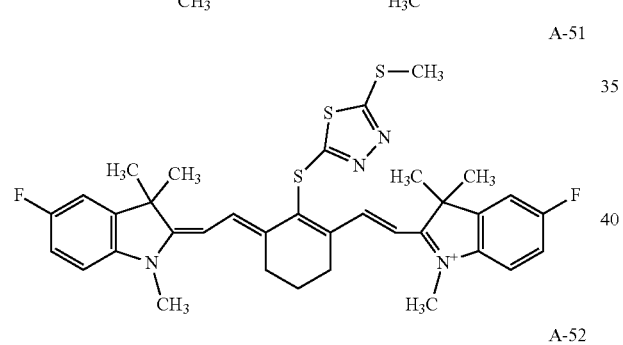
A-52
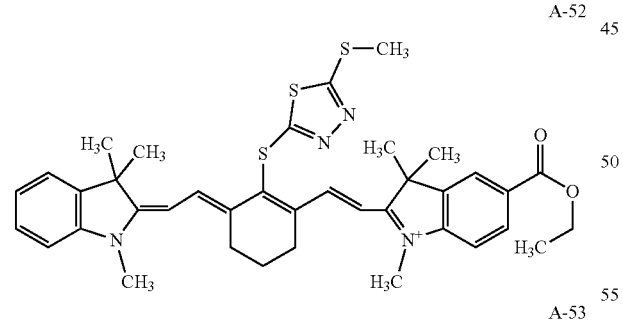
A-53
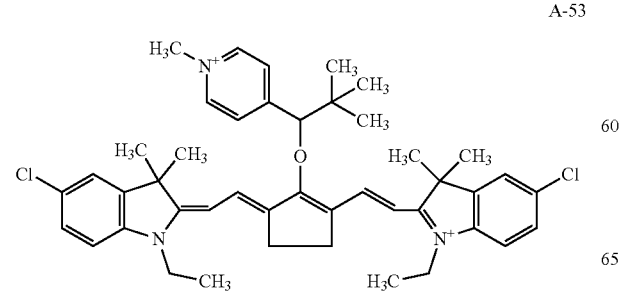
A-54
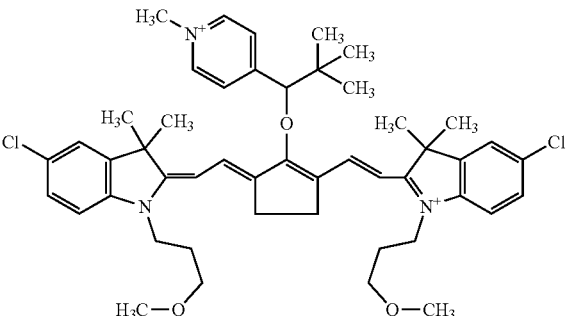
B-1 PF$_6^-$
B-2 BF$_4^-$
B-3 CF$_3$SO$_3^-$
B-4
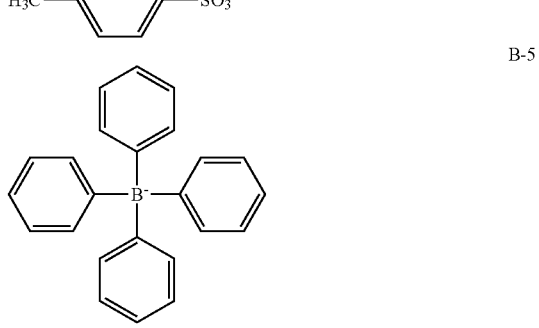
B-5
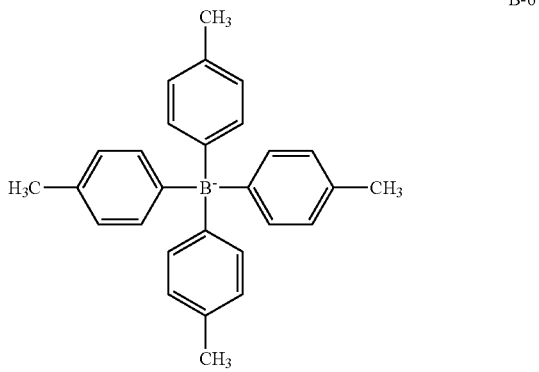
B-6
B-7
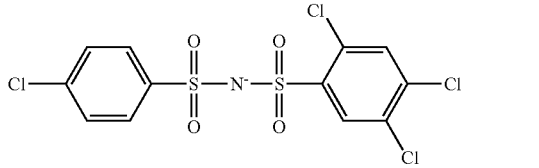
B-8
B-9
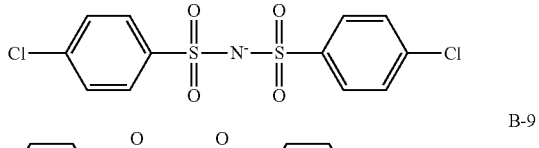

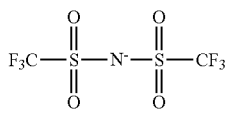

B-10

Na⁺   C-1

K⁺   C-2

(CH₃CH₂)₃NH⁺   C-3

The method of preparing the compound represented by Formula 1 is not particularly limited, and the compound can be prepared with reference to a known method of preparing a cyanine coloring agent. A method described in International Publication WO 2016/027886 can also be suitably used.

The difference (ΔE) between the HOMO of the compound represented by Formula 1, as an infrared absorbent, and the HOMO of at least one compound of polymerization initiators described below is preferably 0.60 eV or less, more preferably from 0.30 eV to 0.60 eV, yet more preferably from 0.40 eV to 0.58 eV, particularly preferably from 0.45 eV to 0.57 eV from the viewpoint of printing durability and color formability.

The difference (ΔE) between the HOMO of the compound represented by Formula 1, infrared absorbent, and the HOMO of the electron-donating polymerization initiator is preferably 0.60 eV or less, more preferably from 0.30 eV to 0.60 eV, yet more preferably from 0.40 eV to 0.58 eV, particularly preferably from 0.45 eV to 0.57 eV from the viewpoint of printing durability and color formability.

The method of calculating the HOMO of any compound in the disclosure is performed according to the following method.

First, the counter anion in an objective compound for calculation is ignored.

Quantum chemical calculation software Gaussian 09 is used, and structure optimization is performed by DFT (B3 LYP/6-31G (d)).

The MO (molecular orbital) energy is calculated with the structure obtained by the structure optimization, according to DFT(B3LYP/6-31+G(d,p)/CPCM (solvent=methanol)).

The MO energy Epre (unit: hartree) obtained according to the MO energy calculation is converted to Eaft (unit: eV) used as the HOMO value in the disclosure, according to the following rule.

$$Eaft=0.823168\times27.2114\times Epre-1.07634$$

Herein, 27.2114 is a coefficient for merely converting hartree to eV, 0.823168 and −1.07634 are control coefficients, and such coefficients are determined so that the HOMO of the objective compound for calculation is matched to the value actually measured.

ΔE is determined from the delta between the HOMO of the compound represented by Formula 1 and the HOMO of a polymerization initiator such as a borate compound. In many cases, the HOMO of the compound represented by Formula 1 is higher than the HOMO of such a polymerization initiator, and ΔE=HOMO of compound represented by Formula 1−HOMO of polymerization initiator is satisfied.

The compound represented by Formula 1 may be used singly, or in combination of two or more kinds thereof. The compound may be used as an infrared absorbent in combination with a pigment and/or a dye.

The content of the infrared absorbent in the image recording layer is preferably from 0.1% by mass to 10.0% by mass, more preferably from 0.5% by mass to 5.0% by mass with respect to the total mass of the image recording layer.

The content of the compound represented by Formula 1 in the image recording layer is preferably from 0.1% by mass to 10.0% by mass, more preferably from 0.5% by mass to 5.0% by mass with respect to the total mass of the image recording layer.

—Other Infrared Absorbent—

The image recording layer may include any infrared absorbent other than the compound represented by Formula 1.

Examples of such any other infrared absorbent include a pigment, and a dye other than the compound represented by Formula 1.

The dye to be used as such any other infrared absorbent can be a commercially available dye and, for example, any known dye described in documents, for example, "Dye Handbook" (edited by The Society of Synthetic Organic Chemistry, Japan, published in 1970). Specific examples thereof include dyes such as an azo dye, a metal complex azo dye, a pyrazolone azo dye, a naphthoquinone dye, an anthraquinone dye, a phthalocyanine dye, a carbonium dye, a quinone imine dye, a methine dye, a cyanine dye, a squarylium coloring agent, a pyrylium salt, and a metal thiolate complex.

Among such dyes, particularly preferable examples include a cyanine coloring agent, a squarylium coloring agent, a pyrylium salt, a nickel thiolate complex, and an indolenine cyanine coloring agent. Furthermore, examples include a cyanine coloring agent and an indolenine cyanine coloring agent. In particular, a cyanine coloring agent is particularly preferable.

Specific examples of the cyanine coloring agent include any compound described in paragraphs 0017 to 0019 of Japanese Patent Application Laid-Open (JP-A) No. 2001-133969, any compound described in paragraphs 0016 to 0021 of JP-A No. 2002-023360, and any compound described in paragraphs 0012 to 0037 of JP-A No. 2002-040638, preferably any compound described in paragraphs 0034 to 0041 of JP-A No. 2002-278057 and any compound described in paragraphs 0080 to 0086 of JP-A No. 2008-195018, particularly preferably any compound described in paragraphs 0035 to 0043 of JP-A No. 2007-90850 and any compound described in paragraphs 0105 to 0113 of JP-A No. 2012-206495.

Any compound described in paragraphs 0008 to 0009 of JP-A No. H05-5005 and any compound described in paragraphs 0022 to 0025 of JP-A No. 2001-222101 can also be preferably used.

Any compound described in paragraphs 0072 to 0076 of JP-A No. 2008-195018 is preferable as the pigment.

Such other infrared absorbent may be used singly, or in combination of two or more kinds thereof. Such pigment and dye may be used in combination in the infrared absorbent.

The content of such other infrared absorbent in the image recording layer is preferably less than the content of the compound represented by Formula 1, more preferably 50% by mass or less relative to the content of the compound represented by Formula 1, yet more preferably 20% by mass or less relative to the content of the compound represented by Formula 1.

—Polymerization Initiator—

The image recording layer contains a polymerization initiator.

The polymerization initiator for use in the disclosure is a compound that generates polymerization initiating species such as radical or cation due to energy of light, heat, or both light and heat, and, for example, a known thermal polymerization initiator, a compound having a bond with small bond dissociation energy, and/or a photopolymerization initiator can be appropriately selected and used.

The polymerization initiator preferably contains an electron-donating polymerization initiator from the viewpoint that electron transfer to a compound represented by Formula 1 having a specified electron-withdrawing group —X at a specified position is promoted, and printing durability and color formability are enhanced.

<<Electron-Donating Polymerization Initiator>>

An electron-donating polymerization initiator is a compound that generates radical due to donating of one electron by intermolecular electron transfer to an orbital of the infrared absorbent, from which one element is drawn, in excitation or intramolecular transfer of any electron of the infrared absorbent with infrared exposure.

The image recording layer more preferably contains an electron-donating polymerization initiator from the viewpoint of an enhancement in printing durability in the lithographic printing plate, and examples of the electron-donating polymerization initiator include the following five electron-donating polymerization initiators.

(i) Alkyl or arylate complex: considered to generate active radical due to oxidative cleavage of a carbon-carbon bond. Specifically, a borate compound is preferable.

(ii) N-arylalkylamine compound: considered to generate active radical due to cleavage of a C—X bond on carbon adjacent to nitrogen, with oxidation. X preferably represents a hydrogen atom, a carboxyl group, a trimethylsilyl group, or a benzyl group. Specific examples include N-phenylglycine (a phenyl group optionally having a substituent.) and N-phenyliminodiacetic acid (a phenyl group optionally having a substituent).

(iii) Sulfur-containing compound: any compound, where a nitrogen atom of any amine described above is replaced with a sulfur atom, can generate active radical due to the same action. Examples include phenylthioacetic acid (a phenyl group optionally having a substituent).

(iv) Tin-containing compound: any compound, where a nitrogen atom of any amine described above is replaced with a tin atom, can generate active radical due to the same action.

(v) Sulfinate: that can generate active radical by oxidation. Specific examples can include sodium arylsulfinate.

In particular, the image recording layer preferably contains a borate compound as the electron-donating polymerization initiator from the viewpoint of printing durability and color formability.

The borate compound is preferably a tetraarylborate compound or a monoalkyltriarylborate compound, more preferably a tetraarylborate compound from the viewpoint of printing durability and color formability.

The counter cation in the borate compound is not particularly limited, and is preferably an alkali metal ion or a tetraalkylammonium ion, more preferably a sodium ion, a potassium ion, or a tetrabutylammonium ion.

Specific examples of the borate compound preferably include sodium tetraphenylborate.

The electron-donating polymerization initiator may be added singly, or may be used in combination of two or more kinds thereof.

The content of the electron-donating polymerization initiator is preferably from 0.01% by mass to 30% by mass, more preferably from 0.05% by mass to 25% by mass, yet more preferably from 0.1% by mass to 20% by mass with respect to the total mass of the image recording layer.

<<Electron-Accepting Polymerization Initiator>>

The polymerization initiator preferably contains an electron-accepting polymerization initiator, more preferably contains the electron-donating polymerization initiator and an electron-accepting polymerization initiator, and yet more preferably is made of the electron-donating polymerization initiator and an electron-accepting polymerization initiator from the viewpoint of printing durability and color formability.

An electron-accepting polymerization initiator is a compound that generates radical due to accepting of one electron by intermolecular electron transfer in excitation of any electron of the infrared absorbent with infrared exposure.

The electron-accepting polymerization initiator is preferably an onium salt compound.

The electron-accepting polymerization initiator may be used singly, or in combination of two or more kinds thereof.

Examples of the electron-accepting polymerization initiator include (a) organic halide, (b) a carbonyl compound, (c) an azo compound, (d) organic peroxide, (e) a metallocene compound, (f) an azide compound, (g) a hexaarylbiimidazole compound, (i) a disulfone compound, (j) an oxime ester compound, and (k) an onium salt compound.

Examples of the organic halide (a) preferably include any compound described in paragraphs 0022 to 0023 of JP-A No. 2008-195018.

Examples of the carbonyl compound (b) preferably include any compound described in paragraph 0024 of JP-A No. 2008-195018.

Examples of the azo compound (c) that can be used include any azo compound described in JP-A No. H08-108621.

Examples of the organic peroxide (d) preferably include any compound described in paragraph 0025 of JP-A No. 2008-195018.

Examples of the metallocene compound (e) preferably include any compound described in paragraph 0026 of JP-A No. 2008-195018.

Examples of the azide compound (f) can include any compound such as 2,6-bis(4-azidebenzylidene)-4-methyl cyclohexanone.

Examples of the hexaarylbiimidazole compound (g) preferably include any compound described in paragraph 0027 of JP-A No. 2008-195018.

Examples of the disulfone compound (i) include any compound described in JP-A No. S61-166544 and JP-A No. 2002-328465.

Examples of the oxime ester compound (j) preferably include any compound described in paragraphs 0028 to 0030 of JP-A No. 2008-195018.

Preferable examples among the above electron-accepting polymerization initiators are any oxime ester compound and any onium salt compound from the viewpoint of curability. In particular, an iodonium salt compound, a sulfonium salt compound, or an azinium salt compound is preferable, an iodonium salt compound or a sulfonium salt compound is more preferable, and an iodonium salt compound is particularly preferable from the viewpoint of printing durability.

Specific examples of such compounds are shown below, but are not limited thereto in the disclosure.

Specifically, the iodonium salt compound is preferably, for example, a diaryliodonium salt compound, in particular, an electron-donating group, more preferably, for example, a diphenyliodonium salt compound substituted with an alkyl group or an alkoxyl group, or preferably an asymmetric diphenyliodonium salt compound. Specific examples include diphenyliodonium=hexafluorophosphate, 4-methoxyphenyl-4-(2-methylpropyl)phenyliodonium=hexafluorophosphate, 4-(2-methylpropyl)phenyl-p-tolyliodonium=hexafluorophosphate, 4-hexyloxyphenyl-2,4,6-trimethoxyphenyliodonium=hexafluorophosphate, 4-hexyloxyphenyl-2,4-diethoxyphenyliodonium=tetrafluoroborate, 4-octyloxyphenyl-2,4,6-trimethoxyphenyliodonium=1-perfluorobutanesulfonate, 4-octyloxyphenyl-2,4,6-trimethoxyphenyliodonium=hexafluorophosphate, and bis(4-t-butylphenyl)iodonium=hexafluorophosphate.

The sulfonium salt compound is preferably, for example, a triarylsulfonium salt compound, in particular, an electron-withdrawing group, for example, preferably a triarylsulfonium salt compound where at least a part of group(s) on an aromatic ring is substituted with a halogen atom, yet more preferably a triarylsulfonium salt compound where the total number of halogen atoms with which groups on an aromatic ring are substituted is 4 or more. Specific examples include triphenylsulfonium=hexafluorophosphate, triphenyl sulfonium=benzoylformate, bis(4-chlorophenyl)phenylsulfonium=benzoylformate, bis(4-chlorophenyl)-4-methylphenyl sulfonium=tetrafluoroborate, tris(4-chlorophenyl)sulfonium=3,5-bis(methoxycarbonyl)benzenesulfonate, tris(4-chlorophenyl)sulfonium=hexafluorophosphate, and tris(2,4-dichlorophenyl)sulfonium=hexafluorophosphate.

The counter anion of the iodonium salt compound and the sulfonium salt compound is preferably a sulfonamide anion or a sulfonimide anion, more preferably a sulfonimide anion.

Examples of the sulfonamide anion or the sulfonimide anion suitably include a sulfonamide anion or a sulfonimide anion in the compound represented by Formula 1.

The content of the electron-accepting polymerization initiator is preferably from 0.1% by mass to 50% by mass, more preferably from 0.5% by mass to 30% by mass, particularly preferably 0.8% by mass to 20% by mass with respect to the total mass of the image recording layer.

In a case in which the polymerization initiator includes an electron-donating polymerization initiator and an electron-accepting polymerization initiator, a counter salt may be formed by an electron-donating polymerizable initiator and the electron-accepting polymerization initiator, or respective salts may be formed.

—Polymerizable Compound—

The image recording layer contains a polymerizable compound.

The polymerizable compound for use in the disclosure may be, for example, a radical polymerizable compound or a cation polymerizable compound, and is preferably an addition-polymerizable compound (ethylenically unsaturated compound) having at least one ethylenically unsaturated bond. The ethylenically unsaturated compound is preferably a compound having at least one terminal ethylenically unsaturated bond, more preferably a compound having two or more terminal ethylenically unsaturated bonds. The polymerizable compound has a chemical form such as a monomer, a pre-polymer, namely, a dimer, a trimer, an oligomer, or a mixture thereof.

Examples of the monomer include unsaturated carboxylic acid (for example, acrylic acid, methacrylic acid, itaconic acid, crotonic acid, isocrotonic acid, or maleic acid), an ester compound thereof, and an amide compound, and a monomer preferably used is an ester compound of unsaturated carboxylic acid and a polyhydric alcohol compound, or an amide compound of unsaturated carboxylic acid and a polyvalent amine compound. For example, an addition reaction product of an unsaturated carboxylic acid ester compound having a nucleophilic substituent such as a hydroxy group, an amino group or a mercapto group, or an amide compound, with a monofunctional or polyfunctional isocyanate compound or an epoxy compound, and a dehydration condensation product with a monofunctional or polyfunctional carboxylic acid are also suitably used. An addition reaction product of an unsaturated carboxylic acid ester compound having an electrophilic substituent such as an isocyanate group or an epoxy group, or an amide compound, with a monofunctional or polyfunctional alcohol compound, an amine compound or a thiol compound, and also a substitution reaction product of an unsaturated carboxylic acid ester compound having a leaving substituent such as a halogen atom or a tosyloxy group, or an amide compound, with a monofunctional or polyfunctional alcohol compound, an amine compound or a thiol compound are also suitable. Another example, a compound, can also be used where the unsaturated carboxylic acid is replaced with, for example, unsaturated phosphonic acid, styrene, or vinyl ether. Such compounds are described in, for example, Japanese National-Phase Publication (JP-A) No. 2006-508380, JP-A No. 2002-287344, JP-A No. 2008-256850, JP-A No. 2001-342222, JP-A No. H09-179296, JP-A No. H09-179297, JP-A No. H09-179298, JP-A No. 2004-294935, JP-A No. 2006-243493, JP-A No. 2002-275129, JP-A No. 2003-64130, JP-A No. 2003-280187, and JP-A No. H10-333321.

Specific examples of the acrylate monomer, as the ester of the polyhydric alcohol compound and the unsaturated carboxylic acid, include ethylene glycol diacrylate, 1,3-butanediol diacrylate, tetramethylene glycol diacrylate, propylene glycol diacrylate, trimethylolpropane triacrylate, hexanediol diacrylate, tetraethylene glycol diacrylate, pentaerythritol tetraacrylate, sorbitol triacrylate, isocyanuric acid ethylene oxide (EO)-modified triacrylate, and a polyester acrylate oligomer. Examples of such a methacrylate monomer include tetramethylene glycol dimethacrylate, neopentyl glycol dimethacrylate, trimethylolpropane trimethacrylate, ethylene glycol dimethacrylate, pentaerythritol trimethacrylate, bis[p-(3-methacryloxy-2-hydroxypropoxy)phenyl]dimethylmethane, and bis[p-(methacryloxyethoxy)phenyl]dimethylmethane. Specific examples of the monomer of the amide of the polyvalent amine compound and the unsaturated carboxylic acid include methylenebisacrylamide, methylenebismethacrylamide, 1,6-hexamethylenebisacrylamide, 1,6-hexamethylenebismethacrylamide, diethylene triamine trisacrylamide, xylylene bisacrylamide, and xylylene bismethacrylamide.

A urethane-based addition-polymerizable compound is also suitable which is produced using an addition reaction of isocyanate with a hydroxy group, and specific examples thereof include a vinyl urethane compound having two or more polymerizable vinyl groups in one molecule, which is obtained by adding a vinyl monomer having a hydroxy group, represented by the following Formula (M), to a polyisocyanate compound having two or more isocyanate groups, described in Japanese Patent Publication (JP-B) No. S 48-41708.

$$CH_2=C(R^{M4})COOCH_2CH(R^{M5})OH \qquad (M)$$

In Formula (M), $R^{M4}$ and $R^{M5}$ each independently represent a hydrogen atom or a methyl group.

Suitable examples also include any urethane acrylate compound described in JP-A No. S51-37193, JP-B No.

H02-32293, JP-B No. H02-16765, JP-A No. 2003-344997, and JP-A No. 2006-65210, any urethane compound having an ethylene oxide-based backbone, described in JP-B No. S58-49860, JP-B No. S56-17654, JP-B No. S62-39417, JP-B No. S62-39418, JP-A No. 2000-250211, and JP-A No. 2007-94138, and any urethane compound having a hydrophilic group, described in U.S. Pat. No. 7,153,632, JP-A No. H08-505958, JP-A No. 2007-293221, and JP-A No. 2007-293223.

The details of the usage method, for example, the structure of the polymerizable compound, single or combination use thereof, and the amount thereof added can be arbitrarily set.

The content of the polymerizable compound is preferably from 5% by mass to 75% by mass, more preferably from 10% by mass to 70% by mass, particularly preferably from 15% by mass to 60% by mass with respect to the total mass of the image recording layer.

—Acid Color Former—

The image recording layer contains an acid color former.

The "acid color former" for use in the disclosure means a compound having the property of developing any color due to heating with an electron-accepting compound (for example, proton of acid) being accepted. The acid color former is, in particular, preferably a colorless compound which has a partial backbone such as lactone, lactam, sultone, spiropyran, ester, or amide and in which such a partial backbone is to be rapidly ring-opened or cleaved due to contact with an electron-accepting compound.

Examples of such an acid color former include any phthalide compound such as 3,3-bis(4-dimethylaminophenyl)-6-dimethylaminophthalide (referred to as "Crystal violet lactone"), 3,3-bis(4-dimethylaminophenyl)phthalide, 3-(4-dimethylaminophenyl)-3-(4-diethylamino-2-methylphenyl)-6-dimethylaminophthalide, 3-(4-dimethylaminophenyl)-3-(1,2-dimethylindol-3-yl)phthalide, 3-(4-dimethylaminophenyl)-3-(2-methylindol-3-yl)phthalide, 3,3-bis(1,2-dimethylindol-3-yl)-5-dimethylaminophthalide, 3,3-bis(1,2-dimethylindol-3-yl)-6-dimethylaminophthalide, 3,3-bis(9-ethylcarbazol-3-yl)-6-dimethylaminophthalide, 3,3-bis(2-phenylindol-3-yl)-6-dimethylaminophthalide, 3-(4-dimethylaminophenyl)-3-(1-methyl pyrrol-3-yl)-6-dimethylaminophthalide, 3,3-bis[1,1-bis(4-dimethylaminophenyl)ethylen-2-yl]-4,5,6,7-tetrachlorophthalide, 3,3-bis[1,1-bis(4-pyrrolizinophenyl)ethylen-2-yl]-4,5,6,7-tetrabromophthalide, 3,3-bis[1-(4-dimethylaminophenyl)-1-(4-methoxyphenyl)ethylen-2-yl]-4,5,6,7-tetrachlophthalide, 3,3-bis[1-(4-pyrrolizinophenyl)-1-(4-methoxyphenyl)ethylen-2-yl]-4,5,6,7-tetrachlorophthalide, 3-[1,1-di(1-ethyl-2-methylindol-3-yl)ethylen-2-yl]-3-(4-diethylaminophenyl)phthalide, 3-[1,1-di(1-ethyl-2-methylindol-3-yl)ethylen-2-yl]-3-(4-N-ethyl-N-phenylaminophenyl)phthalide, 3-(2-ethoxy-4-diethylaminophenyl)-3-(1-n-octyl-2-m ethylindol-3-yl)phthalide, 3,3-bis(1-n-octyl-2-methylindol-3-yl)phthalide, or 3-(2-methyl-4-diethylaminophenyl)-3-(1-n-octyl-2-methylindol-3-yl)phthalide, 4,4-bis-dimethylaminobenzohydrin benzyl ether, N-halophenyl-leuco auramine, N-2,4,5-trichlorophenylleuco auramine, Rhodamine-B-anilinolactam, Rhodamine-(4-nitroanilino)lactam, Rhodamine-B-(4-chloroanilino)lactam, 3,7-bis(diethylamino)-10-benzoylphenoxazine, benzoyl leuco methylene blue, 4-nitrobenzoylmethylene blue, any fluoran compound such as 3,6-dimethoxyfluoran, 3-dim ethylamino-7-methoxyfluoran, 3-diethylamino-6-methoxyfluoran, 3-diethylamino-7-methoxyfluoran, 3-diethylamino-7-chlorofluoran, 3-diethylamino-6-methyl-7-chlorofluoran, 3-diethylamino-6,7-dimethylfluoran, 3-N-cyclohexyl-N-n-butylamino-7-methylfluoran, 3-diethylamino-7-dibenzylaminofluoran, 3-diethylamino-7-octylaminofluoran, 3-diethylamino-7-di-n-hexylaminofluoran, 3-diethylamino-7-anilinofluoran, 3-diethylamino-7-(2'-fluorophenyl amino)fluoran, 3-diethylamino-7-(2'-chlorophenylamino)fluoran, 3-diethyl amino-7-(3'-chlorophenylamino)fluoran, 3-diethylamino-7-(2',3'-dichlorophenylamino)fluoran, 3-diethylamino-7-(3'-trifluoromethylphenylamino)fluoran, 3-di-n-butylamino-7-(2'-fluorophenylamino)fluoran, 3-di-n-butylamino-7-(2'-chlorophenylamino)fluoran, 3-N-isopentyl-N-ethylamino-7-(2'-chlorophenyl amino)fluoran, 3-N-n-hexyl-N-ethyl amino-7-(2'-chlorophenyl amino) fluoran, 3-diethylamino-6-chloro-7-anilinofluoran, 3-di-n-butylamino-6-chloro-7-anilinofluoran, 3-diethyl amino-6-m ethoxy-7-anilinofluoran, 3-di-n-butylamino-6-ethoxy-7-anilinofluoran, 3-pyrrolizino-6-methyl-7-anilinofluoran, 3-piperidino-6-methyl-7-anilinofluoran, 3-morpholino-6-methyl-7-anilinofluoran, 3-dimethylamino-6-methyl-7-anilinofluoran, 3-diethylamino-6-methyl-7-anilinofluoran, 3-di-n-butylamino-6-methyl-7-anilinofluoran, 3-di-n-pentylamino-6-methyl-7-anilinofluoran, 3-N-ethyl-N-methyl-amino-6-methyl-7-anilinofluoran, 3-N-n-propyl-N-methyl-amino-6-methyl-7-anilinofluoran, 3-N-n-propyl-N-ethylamino-6-methyl-7-anilinofluoran, 3-N-n-butyl-N-methylamino-6-methyl-7-anilinofluoran, 3-N-n-butyl-N-ethylamino-6-methyl-7-anilinofluoran, 3-N-isobutyl-N-methylamino-6-methyl-7-anilinofluoran, 3-N-isobutyl-N-ethyl amino-6-methyl-7-anilinofluoran, 3-N-isopentyl-N-ethylamino-6-methyl-7-anilinofluoran, 3-N-n-hexyl-N-m ethylamino-6-ethyl-7-anilinofluoran, 3-N-cyclohexyl-N-ethyl amino-6-methyl-7-anilinofluoran, 3-N-cyclohexyl-N-n-propylamino-6-methyl-7-anilinofluoran, 3-N-cyclohexyl-N-n-butyl amino-6-methyl-7-anilinofluoran, 3-N-cyclohexyl-N-n-hexylamino-6-methyl-7-anilinofluoran, 3-N-cyclohexyl-N-n-octylamino-6-methyl-7-anilinofluoran, 3-N-(2'-methoxyethyl)-N-methylamino-6-methyl-7-anilinofluoran, 3-N-(2'-methoxyethyl)-N-ethylamino-6-methyl-7-anilinofluoran, 3-N-(2'-methoxyethyl)-N-isobutylamino-6-methyl-7-anilinofluoran, 3-N-(2'-ethoxyethyl)-N-methylamino-6-methyl-7-anilinofluoran, 3-N-(2'-ethoxyethyl)-N-ethylamino-6-methyl-7-anilinofluoran, 3-N-(3'-methoxypropyl)-N-methylamino-6-methyl-7-anilinofluoran, 3-N-(3'-methoxypropyl)-N-ethylamino-6-methyl-7-anilinofluoran, 3-N-(3'-ethoxypropyl)-N-methylamino-6-methyl-7-anilinofluoran, 3-N-(3'-ethoxypropyl)-N-ethyl amino-6-methyl-7-anilinofluoran, 3-N-(2'-tetrahydrofurfuryl)-N-ethylamino-6-methyl-7-anilinofluoran, 3-N-(4'-methylphenyl)-N-ethylamino-6-methyl-7-anilinofluoran, 3-diethyl amino-6-ethyl-7-anilinofluoran, 3-diethylamino-6-methyl-7-(3'-methylphenyl amino)fluoran, 3-diethylamino-6-methyl-7-(2',6'-dimethylphenylamino)fluoran, 3-di-n-butyl amino-6-methyl-7-(2',6'-dimethylphenylamino)fluoran, 3-di-n-butylamino-7-(2',6'-dimethylphenylamino)fluoran, 2,2-bis[4'-(3-N-cyclohexyl-N-m ethylamino-6-methylfluoran)-7-yl aminophenyl]propane, 3-[4'-(4-phenyl)aminophenyl] amino-6-methyl-7-chlorofluoran, or 3-[4'-(dimethylaminophenyl)]amino-5,7-dimethylfluoran, a phthalide compound such as 3-(2-methyl-4-diethylaminophenyl)-3-(1-ethyl-2-methylindol-3-yl)-4-azaphthalide, 3-(2-n-propoxycarbonylamino-4-di-n-propylaminophenyl)-3-(1-ethyl-2-methylindol-3-yl)-4-azaphthalide, 3-(2-methylamino-4-di-n-propylaminophenyl)-3-(1-ethyl-2-methylindol-3-yl)-4-azaphthalide, 3-(2-methyl-4-di-n-hexylaminophenyl)-3-(1-n-octyl-2-methylindol-3-yl)-4,7- diazaphthalide, 3,3-bis(2-ethoxy-4-diethylaminophenyl)-4-azaphthalide, 3,3-bis(1-n-octyl-2-methylindol-3-yl)-4-azaphthalide, 3-(2-ethoxy-4-diethylaminophenyl)-3-(1-ethyl-2-methylindol-3-yl)-4-azaphthalide, 3-(2-ethoxy-4-diethylaminophenyl)-3-(1-octyl-2-methylindol-3-yl)-4 or 7-azaphthalide, 3-(2-ethoxy-4-di ethyl aminophenyl)-3-(1-ethyl-2-methylindol-3-yl)-4 or 7-azaphthalide, 3-(2-hexyloxy-4-diethylaminophenyl)-3-(1-ethyl-2-methylindol-3-yl)-4 or 7-azaphthalide, 3-(2-ethoxy-4-diethylaminophenyl)-3-(1-ethyl-2-phenylindol-3-yl)-4 or 7-azaphthalide, 3-(2-butoxy-4-di ethylaminophenyl)-3-(1-ethyl-2-phenylindol-3-yl)-4 or 7-azaphthalide, 3-methyl-spiro-dinaphthopyran, 3-ethyl-spiro-dinaphthopyran, 3-phenyl-spiro-dinaphthopyran, 3-benzyl-spiro-dinaphthopyran, 3-methyl-naphtho-(3-methoxybenzo)spiropyran, 3-propyl-spiro-dibenzopyran-3,6-bis(dimethylamino)fluorene-9-spiro-3'-(6'-dimethylamino)-phthalide, or 3,6-bis(diethylamino)fluorene-9-spiro-3'-(6'-dimethylamino)phthalide, and other compound such as 2'-anilino-6'-(N-ethyl-N-isopentyl)amino-3'-methylspiro[isobenzofuran-1(3H),9'-(9H)xanthen-3-one, 2'-anilino-6'-(N-ethyl-N-(4-methylphenyl))amino-3'-methylspiro[isobenzofuran-1(3H),9'-(9H)xanthen]-3-one, 3'-N,N-dibenzylamino-6'-N,N-dibenzylamino-6'-N,N-diethylaminospiro[isobenzofuran-1(3H),9'-(9H)xanthen]-3-one, or 2'-(N-methy-N-phenyl)amino-6'-(N-ethyl-N-(4-methylphenyl))aminospiro[isobenzofuran-1(3H),9'-(9H)xanthen]-3-one.

In particular, the acid color former for use in the disclosure is preferably at least one compound selected from the group consisting of a spiropyran compound, a spirooxazine compound, a spirolactone compound, and a spirolactam compound from the viewpoint of color formability.

The hue of the coloring agent after color development is preferably green, blue, or black from the viewpoint of visibility.

A commercially available product can also be used as the acid color former, and examples thereof include ETAC, RED500, RED520, CVL, S-205, BLACK305, BLACK400, BLACK100, BLACK500, H-7001, GREEN300, NIR-BLACK78, BLUE220, H-3035, BLUE203, ATP, H-1046, and H-2114 (all are manufactured by Fukui Yamada Chemical Co., Ltd.), ORANGE-DCF, Vermilion-DCF, PINK-DCF, RED-DCF, BLMB, CVL, GREEN-DCF, and TH-107 (all are manufactured by Hodogaya Chemical Co., Ltd.), ODB, ODB-2, ODB-4, ODB-250, ODB-Black XX, Blue-63, Blue-502, GN-169, GN-2, Green-118, Red-40, and Red-8 (all are manufactured by Yamamoto Chemicals Inc.), and Crystal violet lactone (manufactured by Tokyo Chemical Industry Co., Ltd.). ETAC, S-205, BLACK305, BLACK400, BLACK100, BLACK500, H-7001, GREEN300, NIR-BLACK78, H-3035, ATP, H-1046, H-2114, GREEN-DCF, Blue-63, GN-169, and Crystal violet lactone are preferable among the above commercially available products because a film to be formed has a favorable rate of absorption of visible light.

Such acid color formers can also be used singly, or in combination of two or more kinds of components.

The content of the acid color former is preferably from 0.5% by mass to 10% by mass, more preferably from 1% by mass to 5% by mass with respect to the total mass of the image recording layer.

—Polymer Particle—

The image recording layer may contain a polymer particle.

The polymer particle is preferably selected from the group consisting of a thermoplastic polymer particle, a thermally reactive polymer particle, a polymer particle having a polymerizable group, a microcapsule encapsulating a hydrophobic compound, and microgel (cross-linked polymer particle). In particular, a polymer particle having a polymerizable group, or microgel is preferable. In a particularly preferable embodiment, the polymer particle includes at least one ethylenically unsaturated polymerizable group. The presence of such a polymer particle allows an effect of enhancing printing durability of an exposed portion and on-press developability of an unexposed portion, to be obtained.

The polymer particle is preferably a thermoplastic polymer particle.

A preferable thermoplastic polymer particle is preferably any thermoplastic polymer particle described in Research Disclosure No. 33303 issued on January 1992, JP-A No. H09-123387, JP-A No. H09-131850, JP-A No. H09-171249 and JP-A No. H09-171250, and Europe Patent No. 931647.

Specific examples of a polymer constituting such a thermoplastic polymer particle can include a homopolymer or copolymer of an acrylate or methacrylate monomer having an ethylene, styrene, vinyl chloride, methyl acrylate, ethyl acrylate, methyl methacrylate, ethyl methacrylate, vinylidene chloride, acrylonitrile, vinyl carbazole or polyalkylene structure, or a mixture thereof. Examples can preferably include polystyrene, a copolymer containing styrene and acrylonitrile, or polymethyl methacrylate. The average particle size of the thermoplastic polymer particle is preferably from 0.01 μm to 3.0 μm.

Examples of the thermally reactive polymer particle include a polymer particle having a thermally reactive group. The thermally reactive polymer particle forms a hydrophobized region due to cross-linking by a heat reaction and the change in functional group here.

In a case in which the polymer particle has a thermally reactive group, such a thermally reactive group may be any functional group as long as a chemical bond is formed, and such a group is preferably a polymerizable group, and examples preferably include an ethylenically unsaturated group for performing a radical polymerization reaction (for example, an acryloyl group, a methacryloyl group, a vinyl group, or an allyl group), a cation polymerizable group (for example, a vinyl group, a vinyloxy group, an epoxy group, or an oxetanyl group), an isocyanate group for performing an addition reaction, or a block group thereof an epoxy group, a vinyloxy group, and a functional group having an active hydrogen atom, serving as its reaction partner (for example, an amino group, a hydroxy group, or a carboxy group), a carboxy group for performing a condensation reaction, and a hydroxy group or an amino group serving as a reaction partner thereof, and an acid anhydride for performing a ring-opening addition reaction, and an amino group or a hydroxy group serving as a reaction partner thereof.

Examples of the microcapsule include any microcapsule encapsulating at least some of constituent components of the image recording layer, as described in JP-A No. 2001-277740 and JP-A No. 2001-277742. The image recording layer can also contain any constituent component out of the microcapsule. A preferable aspect of the image recording layer containing the microcapsule is an aspect where a hydrophobic constituent component is encapsulated in the microcapsule and a hydrophilic constituent component is contained out of the microcapsule.

The microgel (cross-linked polymer particle) can contain some of constituent components of the image recording layer on or in the surface of the microgel. In particular, a reactive microgel having a radical polymerizable group on the surface thereof is preferable from the viewpoint of image forming sensitivity and printing durability.

A known method can be applied in order to form constituent components of the image recording layer into the microcapsule or the microgel.

The polymer particle is preferably one obtained by a reaction of a polyvalent isocyanate compound as an adduct of a polyhydric phenol compound having two or more hydroxy groups in the molecule and isophorone diisocyanate, with a compound having active hydrogen, from the viewpoint of printing durability, stain resistance, and storage stability.

The polyhydric phenol compound is preferably a compound having a plurality of benzene rings having a phenolic hydroxy group.

The compound having active hydrogen is preferably a polyol compound or a polyamine compound, more preferably a polyol compound, yet more preferably at least one compound selected from the group consisting of propylene glycol, glycerin, and trimethylolpropane.

Examples of a particle of a resin obtained by a reaction of the polyvalent isocyanate compound as an adduct of a polyhydric phenol compound having two or more hydroxy groups in the molecule and isophorone diisocyanate, with the compound having active hydrogen include any polymer particle described in paragraphs 0032 to 0095 of JP-A No. 2012-206495.

The polymer particle preferably has a hydrophobic main chain and includes both i) a constituent unit having a pendant cyano group directly bound to the hydrophobic main chain and ii) a constituent unit having a pendant group including a hydrophilic polyalkylene oxide segment, from the viewpoint of printing durability and solvent resistance.

Examples of the hydrophobic main chain preferably include an acrylic resin chain.

Examples of the pendant cyano group include —[CH$_2$CH(C≡N)—] or —[CH$_2$C(CH$_3$)(C≡N)—].

The constituent unit having a pendant cyano group can be easily derived from an ethylene-based unsaturated monomer, for example, acrylonitrile or methacrylonitrile, or a combination thereof.

The alkylene oxide in the hydrophilic polyalkylene oxide segment is preferably ethylene oxide or propylene oxide, more preferably ethylene oxide.

The repetition number of the alkylene oxide structure in the hydrophilic polyalkylene oxide segment is preferably from 10 to 100, more preferably from 25 to 75, yet more preferably from 40 to 50.

Examples of the particle of the resin having a hydrophobic main chain and including both i) a constituent unit having a pendant cyano group directly bound to the hydrophobic main chain and ii) a constituent unit having a pendant group including a hydrophilic polyalkylene oxide segment include any particle described in paragraphs 0039 to 0068 of JP-A No. 2008-503365.

The average particle size of the polymer particle is preferably from 0.01 µm to 3.0 µm, more preferably from 0.03 µm to 2.0 µm, yet more preferably from 0.10 µm to 1.0 µm. Such a range allows favorable resolution and aging stability to be obtained.

The average primary particle size of each particle described above in the disclosure is measured by a light scattering method, or determined by taking an electron micrograph of the particle, and measuring the particle size in the micrograph for 5,000 of the particles in total to thereby calculate the average value. In the case of a non-spherical particle, the particle size value of a spherical particle having the same particle area as that of the non-spherical particle in the micrograph is defined as the particle size.

The average particle size in the disclosure means the volume average particle size, unless particularly noted.

The content of the polymer particle is preferably from 5% by mass to 90% by mass with respect to the total mass of the image recording layer.

—Binder Polymer—

The image recording layer may contain a binder polymer.

The binder polymer is preferably a (meth)acrylic resin, a polyvinyl acetal resin, or a polyurethane resin.

In particular, a known binder polymer for use in the image recording layer of a lithographic printing plate precursor can be suitably used as the above binder polymer. One example thereof is described in detail, with respect to a binder polymer for use in an on-press development type lithographic printing plate precursor (hereinafter, also referred to as "binder polymer for on-press development").

The binder polymer for on-press development is preferably a binder polymer having an alkylene oxide chain. The binder polymer having an alkylene oxide chain may have a poly(alkylene oxide) site in a main chain or a side chain. The binder polymer may also be a graft polymer having poly (alkylene oxide) in a side chain or a block copolymer of a block constituted by a repeating unit containing poly(alkylene oxide) and a block constituted by a repeating unit containing no (alkylene oxide).

In a case in which the binder polymer has a poly(alkylene oxide) site in a main chain, the binder polymer is preferably a polyurethane resin. In a case in which the binder polymer has a poly(alkylene oxide) site in a side chain, examples of the polymer in a main chain include a (meth)acrylic resin, a polyvinyl acetal resin, a polyurethane resin, a polyurea resin, a polyimide resin, a polyamide resin, an epoxy resin, a polystyrene resin, a novolac phenol resin, a polyester resin, synthetic rubber, and natural rubber, and a (meth)acrylic resin is particularly preferable.

Other preferable examples of the binder polymer include a polymer compound including from hexa- to deca-functional thiol serving as a nuclear and having a polymer chain bound to the nuclear via a sulfide bond, in which the polymer chain has a polymerizable group (hereinafter, also referred to as "star polymer compound"). The star polymer compound that can be preferably used is any compound described in JP-A No. 2012-148555.

Examples of the star polymer compound include a compound having a polymerizable group, such as an ethylenically unsaturated bond, for an enhancement in film hardness of an image area, in a main chain or a side chain, preferably in a side chain, described in JP-A No. 2008-195018. Such a polymerizable group allows cross-linking between polymer molecules to be formed, resulting in promotion of curing.

The polymerizable group is preferably an ethylenically unsaturated group such as a (meth)acrylic group, a vinyl group, an allyl group, or a styryl group, or an epoxy group, and is more preferably a (meth)acrylic group, a vinyl group, or a styryl group, particularly preferably a (meth)acrylic group from the viewpoint of polymerization reactivity. Such a group can be introduced to the polymer through a polymer reaction or copolymerization. For example, a reaction of a polymer having a carboxy group in a side chain with glycidyl methacrylate, or a reaction of a polymer having an epoxy group with ethylenically unsaturated group-containing carboxylic acid such as methacrylic acid can be utilized. Such groups may be used in combination.

The molecular weight of the binder polymer is preferably 2,000 or more, more preferably 5,000 or more, yet more preferably from 10,000 to 300,000 in terms of the weight average molecular weight (Mw) as a polystyrene conversion value according to a GPC method.

Any hydrophilic polymer such as polyacrylic acid or polyvinyl alcohol described in JP-A No. 2008-195018 can be, if necessary, used in combination. A lipophilic polymer and a hydrophilic polymer can be used in combination.

The binder polymer may be used singly, or in combination of two or more kinds thereof, in the image recording layer for use in the disclosure.

The binder polymer can be contained in any amount in the image recording layer, and the content of the binder polymer is preferably from 1% by mass to 90% by mass, more preferably from 5% by mass to 80% by mass with respect to the total mass of the image recording layer.

—Chain Transfer Agent—

The image recording layer for use in the disclosure may contain a chain transfer agent. The chain transfer agent contributes to an enhancement in printing durability in the lithographic printing plate.

The chain transfer agent is preferably a thiol compound, more preferably a thiol having 7 or more carbon atoms, yet more preferably a compound having a mercapto group in an aromatic ring (aromatic thiol compound) from the viewpoint of the boiling point (difficulty of volatilization). The thiol compound is preferably a monofunctional thiol compound.

Specific examples of the chain transfer agent include the following compounds.

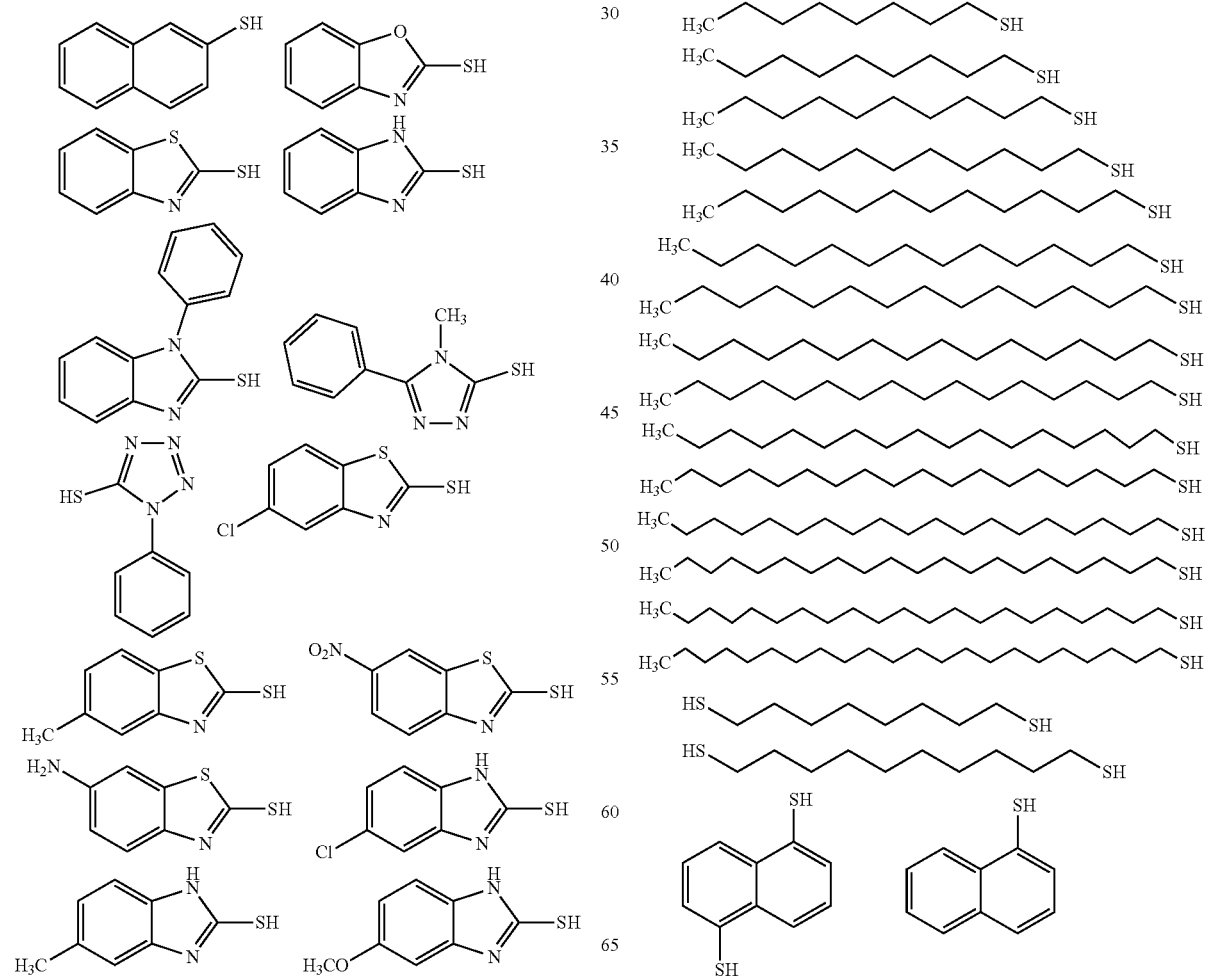

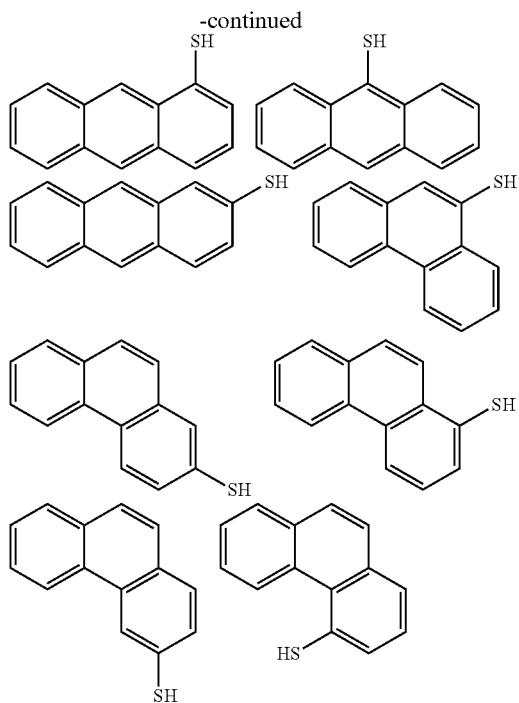

The chain transfer agent may be added singly, or may be used in combination of two or more kinds thereof.

The content of the chain transfer agent is preferably from 0.01% by mass to 50% by mass, more preferably from 0.05% by mass to 40% by mass, yet more preferably from 0.1% by mass to 30% by mass with respect to the total mass of the image recording layer.

—Low-Molecular-Weight Hydrophilic Compound—

The image recording layer may contain a low-molecular-weight hydrophilic compound in order to enhance on-press developability with deterioration in printing durability being suppressed. The low-molecular-weight hydrophilic compound is preferably a compound having a molecular weight of less than 1,000, more preferably a compound having a molecular weight of less than 800, yet more preferably a compound having a molecular weight of less than 500.

Examples of the low-molecular-weight hydrophilic compound, for example, a water-soluble organic compound, include a glycol compound such as ethylene glycol, diethylene glycol, triethylene glycol, propylene glycol, dipropylene glycol, or tripropylene glycol, and an ether or ester derivative thereof, a polyol compound such as glycerin, pentaerythritol, or tris(2-hydroxyethyl)isocyanurate, an organic amine compound such as triethanolamine, diethanolamine, or monoethanolamine, and a salt thereof, an organic sulfonic acid compound such as alkylsulfonic acid, toluenesulfonic acid, or benzenesulfonic acid, and a salt thereof, an organic sulfamic acid compound such as alkylsulfamic acid, and a salt thereof, an organic sulfuric acid compound such as alkylsulfuric acid, alkyl ether sulfuric acid, and a salt thereof an organic phosphonic acid compound such as phenylphosphonic acid, and a salt thereof, an organic carboxylic acid compound such as tartaric acid, oxalic acid, citric acid, malic acid, lactic acid, gluconic acid, or amino acid compound, and a salt thereof, and a betaine compound.

It is preferable to contain at least one selected from a polyol compound, an organic sulfate compound, an organic sulfonate compound, or a betaine compound, as the low-molecular-weight hydrophilic compound.

Specific examples of the organic sulfonate compound include alkylsulfonate such as sodium n-butylsulfonate, sodium n-hexylsulfonate, sodium 2-ethyl hexyl sulfonate, sodium cyclohexylsulfonate, or sodium n-octylsulfonate; alkylsulfonate including an ethylene oxide chain, such as sodium 5,8,11-trioxapentadecane-1-sulfonate, sodium 5,8,11-trioxaheptadecane-1-sulfonate, sodium 13-ethyl-5,8,11-trioxaheptadecane-1-sulfonate, or sodium 5,8,11,14-tetraoxatetracosane-1-sulfonate; aryl sulfonate such as sodium benzenesulfonate, sodium p-toluenesulfonate, sodium p-hydroxybenzenesulfonate, sodium p-styrenesulfonate, sodium isophthalic acid dimethyl-5-sulfonate, sodium 1-naphthylsulfonate, sodium 4-hydroxynaphthylsulfonate, sodium 1,5-naphthalenedisulfonate, or sodium 1,3,6-naphthalenetrisulfonate, and any compound described in paragraphs 0026 to 0031 of JP-A No. 2007-276454 and paragraphs 0020 to 0047 of JP-A No. 2009-154525. Such a salt may be a potassium salt or a lithium salt.

Examples of the organic sulfate compound include alkyl, alkenyl, alkynyl, aryl, or heterocyclic monoether sulfate of polyethylene oxide. The number of ethylene oxide unit(s) is preferably from 1 to 4, and the salt is preferably a sodium salt, a potassium salt, or a lithium salt. Specific examples include any compound described in paragraphs 0034 to 0038 of JP-A No. 2007-276454.

The betaine compound is preferably a compound with a hydrocarbon substituent having from 1 to 5 carbon atoms on a nitrogen atom, and specific examples include trimethylammonium acetate, dimethylpropylammonium acetate, 3-hydroxy-4-trimethylammoniobutyrate, 4-(1-pyridinio)butyrate, 1-hydroxyethyl-1-imidazolioacetate, trimethylammonium methanesulfonate, dimethylpropylammonium methanesulfonate, and 3-trimethylammonio-1-propanesulfonate, and 3-(1-pyridinio)-1-propanesulfonate.

The low-molecular-weight hydrophilic compound has a small structure of a hydrophobic moiety and has almost no surface activity, and thus can allow the image recording layer to favorably keep ink acceptability and printing durability without any deterioration in hydrophobicity and film hardness of an image area due to dampening water penetrating into an exposed portion (image area) of the image recording layer.

The content of the low-molecular-weight hydrophilic compound is preferably from 0.5% by mass to 20% by mass, more preferably from 1% by mass to 15% by mass, yet more preferably from 2% by mass to 10% by mass with respect to the total mass of the image recording layer. Such a range allows favorable on-press developability and printing durability to be obtained.

The low-molecular-weight hydrophilic compound may be used singly, or in mixture of two or more kinds thereof —Sensitizer—

The image recording layer may contain a sensitizer such as a phosphonium compound, a nitrogen-containing low-molecular-weight compound, or an ammonium group-containing polymer for an enhancement in inking properties. In particular, in a case in which a protective layer contains an inorganic layered compound, such a compound can serve as a surface-covering agent of the inorganic layered compound, thereby allowing deterioration in inking properties due to the inorganic layered compound in printing to be suppressed.

The sensitizer is preferably used as a combination of a phosphonium compound, a nitrogen-containing low-molecular-weight compound, and an ammonium group-containing polymer, more preferably used as a combination of a phosphonium compound, a quaternary ammonium salt compound, and an ammonium group-containing polymer.

Examples of the phosphonium compound include any phosphonium compound described in JP-A No. 2006-297907 and JP-A No. 2007-50660. Specific examples include tetrabutylphosphonium iodide, butyltriphenylphosphonium bromide, tetraphenylphosphonium bromide, 1,4-bis(triphenylphosphonio)butane=di(hexafluorophosphate), 1,7-bis(triphenylphosphonio)heptane=sulfate, and 1,9-bis(triphenylphosphonio)nonane=naphthalene-2,7-disulfonate.

Examples of the nitrogen-containing low-molecular-weight compound include an amine salt compound and a quaternary ammonium salt compound. Examples also include an imidazolium salt compound, a benzoimidazolium salt compound, a pyridinium salt compound, and a quinolinium salt compound. In particular, examples preferably include a quaternary ammonium salt compound and a pyridinium salt compound. Specific examples include tetramethylammonium=hexafluorophosphate, tetrabutylammonium=hexafluorophosphate, dodecyltrimethylammonium=p-toluenesulfonate, benzyltriethyl ammonium=hexafluorophosphate, benzyldimethyloctylammonium=hexafluorophosphate, benzyldimethyldodecylammonium=hexafluorophosphate, and any compound described in paragraphs 0021 to 0037 of JP-A No. 2008-284858 and paragraphs 0030 to 0057 of JP-A No. 2009-90645.

The ammonium group-containing polymer may have an ammonium group in the structure, and is preferably a polymer having from 5% by mol to 80% by mol of (meth) acrylate having an ammonium group in a side chain, as a copolymerization component. Specific examples include any polymer described in paragraphs 0089 to 0105 of JP-A No. 2009-208458.

The ammonium salt-containing polymer is preferably a polymer having a reduced specific viscosity (unit: mL/g) value in a range of from 5 to 120, more preferably in a range of from 10 to 110, particularly preferably in a range of from 15 to 100, determined by a measurement method described in JP-A No. 2009-208458. The reduced specific viscosity is preferably from 10,000 to 150,000, more preferably from 17,000 to 140,000, particularly preferably from 20,000 to 130,000, as converted into the weight average molecular weight (Mw).

Specific examples of the ammonium group-containing polymer are shown below.

(1) 2-(trimethylammonio)ethyl methacrylate=p-toluenesulfonate/3,6-dioxaheptyl methacrylate copolymer (molar ratio 10/90, Mw 45,000)

(2) 2-(trimethylammonio)ethyl methacrylate=hexafluorophosphate/3,6-dioxaheptyl methacrylate copolymer (molar ratio 20/80, Mw 60,000)

(3) 2-(ethyl dimethylammonio)ethyl methacrylate=p-toluenesulfonate/hexyl methacrylate copolymer (molar ratio 30/70, Mw 45,000)

(4) 2-(trimethyl ammonio)ethyl methacrylate=hexafluorophosphate/2-ethylhexyl methacrylate copolymer (molar ratio 20/80, Mw 60,000)

(5) 2-(trimethylammonio)ethyl methacrylate=methyl sulfate/hexyl methacrylate copolymer (molar ratio 40/60, Mw 70,000)

(6) 2-(butyldimethylammonio)ethyl methacrylate=hexafluorophosphate/3,6-dioxaheptyl methacrylate copolymer (molar ratio 25/75, Mw 65,000)

(7) 2-(butyldimethylammonio)ethyl acrylate=hexafluorophosphate/3,6-dioxaheptyl methacrylate copolymer (molar ratio 20/80, Mw 65,000)

(8) 2-(butyldimethylammonio)ethyl methacrylate=13-ethyl-5,8,11-trioxa-1-heptadecane sulfonate/3,6-dioxaheptyl methacrylate copolymer (molar ratio 20/80, Mw 75,000)

(9) 2-(butyldimethyl ammonio)ethyl methacrylate=hexafluorophosphate/3,6-dioxaheptyl methacrylate/2-hydroxy-3-methacryloyloxypropyl methacrylate copolymer (molar ratio 15/80/5, Mw 65,000)

The content of the sensitizer is preferably from 0.01% by mass to 30.0% by mass, more preferably from 0.1% by mass to 15.0% by mass, yet more preferably from 1% by mass to 10% by mass with respect to the total mass of the image recording layer.

—Other Component(s)—

The image recording layer can contain other component(s) such as a surfactant, a polymerization inhibitor, a higher fatty acid derivative, a plasticizer, an inorganic particle, and an inorganic layered compound. Specifically, such component(s) can be found with reference to the description of paragraphs 0114 to 0159 of JP-A No. 2008-284817.

—Formation of Image Recording Layer—

The image recording layer in the lithographic printing plate precursor according to the disclosure can be formed by, for example, dispersing or dissolving required respective components described above in a known solvent to thereby prepare a coating solution, coating a support with the coating solution according to a known method such as coating by a bar coater, and drying the resultant, as described in paragraphs 0142 to 0143 of JP-A No. 2008-195018. The amount (solid content) of coating of the image recording layer after coating and drying varies depending on the intended use, and is preferably from 0.3 g/m$^2$ to 3.0 g/m$^2$. Such a range allows favorable sensitivity and favorable film properties of the image recording layer to be obtained.

A known solvent can be used as the solvent. Specific examples include water, acetone, methyl ethyl ketone (2-butanone), cyclohexane, ethyl acetate, ethylene dichloride, tetrahydrofuran, toluene, ethylene glycol monomethyl ether, ethylene glycol monoethyl ether, ethylene glycol dimethyl ether, propylene glycol monomethyl ether, propylene glycol monoethyl ether, acetyl acetone, cyclohexanone, diacetone alcohol, ethylene glycol monomethyl ether acetate, ethylene glycol ethyl ether acetate, ethylene glycol monoisopropyl ether, ethylene glycol monobutyl ether acetate, 1-methoxy-2-propanol, 3-methoxy-1-propanol, methoxymethoxyethanol, diethylene glycol monomethyl ether, diethylene glycol monoethyl ether, diethylene glycol dimethyl ether, diethylene glycol diethyl ether, propylene glycol monomethyl ether acetate, propylene glycol monoethyl ether acetate, 3-methoxypropyl acetate, N,N-dimethylformamide, dimethylsulfoxide, γ-butyrolactone, methyl lactate, and ethyl lactate. The solvent may be used singly, or in combination of two or more kinds thereof. The solid content concentration in the coating solution is preferably from about 1 to 50% by mass.

The amount (solid content) of coating of the image recording layer after coating and drying varies depending on the intended use, and is preferably from about 0.3 to 3.0 g/m$^2$ from the viewpoint of allowing favorable sensitivity and favorable film properties of the image recording layer to be obtained.

<Hydrophilic Support>

The hydrophilic support (hereinafter, also simply referred to as "support".) in the lithographic printing plate precursor according to the disclosure can be appropriately selected from a known hydrophilic support for a lithographic printing plate precursor, and can be used. The hydrophilic support is preferably an aluminum plate subjected to a surface roughening treatment and an anodization treatment according to a known method.

The aluminum plate may be, if necessary, further subjected to any treatment appropriately selected from a micropore enlargement treatment or a pore-sealing treatment of an anodized film, described in JP-A No. 2001-253181 and JP-A No. 2001-322365, a hydrophilic treatment of a surface, with alkali metal silicate, described in each specification of U.S. Pat. Nos. 2,714,066, 3,181,461, 3,280,734, and 3,902,734, or a hydrophilic treatment of a surface, with polyvinyl phosphonic acid or the like, described in each specification of U.S. Pat. Nos. 3,276,868, 4,153,461, and 4,689,272.

The support preferably has a center line average roughness of from 0.10 µm to 1.2 µm.

The support may have, if necessary, a back coat layer including an organic polymer compound, described in JP-A No. H05-45885, or a back coat layer including an alkoxy compound of silicon, described in JP-A No. H06-35174, on a surface thereof, the surface being located opposite to the image recording layer.

<Undercoat Layer>

The lithographic printing plate precursor according to the disclosure preferably includes an undercoat layer (sometimes referred to as "intermediate layer".) between the image recording layer and the support. The undercoat layer allows adhesion between the support and the image recording layer to be improved in an exposed portion and allows peeling of the image recording layer from the support to easily occur in an unexposed portion, and thus contributes to an enhancement in developability without any printing durability being impaired. The undercoat layer also serves as a heat insulating layer in exposure of infrared laser, and thus has an effect of preventing a reduction in sensitivity due to diffusion of heat generated by the exposure, into the support.

Examples of the compound for use in the undercoat layer include a polymer having an adsorbable group that can adsorb to the surface of the support, and a hydrophilic group. A polymer having an adsorbable group and a hydrophilic group, and further having a cross-linkable group is preferable for an enhancement in adhesiveness to the image recording layer. The compound for use in the undercoat layer may be a low-molecular-weight compound or a polymer. The compound for use in the undercoat layer may be, if necessary, in mixture of two or more kinds thereof.

In a case in which the compound for use in the undercoat layer is a polymer, a copolymer of a monomer having an adsorbable group, a monomer having a hydrophilic group, and a monomer having a cross-linkable group is preferable.

The adsorbable group that can adsorb to the surface of the support is preferably a phenolic hydroxy group, a carboxy group, $-PO_3H_2$, $-OPO_3H_2$, $-CONHSO_2-$, $-SO_2NHSO_2-$, or $-COCH_2COCH_3$. The hydrophilic group is preferably a sulfo group or a salt thereof, or a salt of a carboxy group. The cross-linkable group is preferably an acrylic group, a methacrylic group, an acrylamide group, a methacrylamide group, or an allyl group.

The polymer may have a cross-linkable group introduced by salt formation of a polar substituent of the polymer and a compound having a substituent having a counter charge to that of the polar substituent and an ethylenically unsaturated bond, or may be one where any other monomer than the above, preferably a hydrophilic monomer is further copolymerized.

Specific examples suitably include a silane coupling agent having an addition-polymerizable, ethylenically double bond reaction group, described in JP-A No. H10-282679, and a phosphorus compound having an ethylenically double bond reaction group, described in JP-A No. H02-304441. A low-molecular-weight or polymer compound is also preferably used which has a cross-linkable group (preferably, ethylenically unsaturated bond group), a functional group that interacts with the surface of the support, and a hydrophilic group, described in JP-A No. 2005-238816, JP-A No. 2005-125749, JP-A No. 2006-239867, and JP-A No. 2006-215263.

More preferably, a polymer is exemplified which has an adsorbable group that can adsorb to the surface of the support, a hydrophilic group, and a cross-linkable group, described in JP-A No. 2005-125749 and JP-A No. 2006-188038.

The content of the ethylenically unsaturated bond in the polymer for use in the undercoat layer is preferably from 0.1 mmol to 10.0 mmol, more preferably from 0.2 mmol to 5.5 mmol per gram of the polymer.

The weight average molecular weight (Mw) of the polymer for use in the undercoat layer is preferably 5,000 or more, more preferably from 10,000 to 300,000.

The undercoat layer may contain a chelator, secondary or tertiary amine, a polymerization inhibitor, or a compound having not only an amino group or a functional group having polymerization inhibition ability, but also a group that interacts with the surface of the support (for example, 1,4-diazabicyclo[2.2.2]octane (DABCO), 2,3,5,6-tetrahydroxy-p-quinone, chloranil, sulfophthalic acid, hydroxyethylethylenediaminetriacetic acid, dihydroxyethylethylenediaminediacetic acid, or hydroxyethyliminodiacetic acid), other than the compound for the undercoat layer, for stain prevention due to aging.

The undercoat layer is applied according to a known method. The amount (solid content) of coating of the undercoat layer is preferably from 0.1 mg/m² to 100 mg/m², more preferably from 1 mg/m² to 30 mg/m².

<Protective Layer>

The lithographic printing plate precursor according to the disclosure preferably includes a protective layer (sometimes referred to as "overcoat layer".) on the image recording layer. The protective layer has not only the function of suppressing an image formation inhibition reaction due to oxygen blocking, but also the function of preventing the image recording layer from being scratched and the function of preventing ablation in exposure to high illuminance laser.

The protective layer having such properties is described in, for example, U.S. Pat. No. 3,458,311 and JP-B No. S55-49729. Any of a water-soluble polymer or a water-insoluble polymer can be appropriately selected and used as a low oxygen-permeable polymer for use in the protective layer, and can be, if necessary, used as a mixture of two or more kinds thereof. Specific examples include polyvinyl alcohol, modified polyvinyl alcohol, polyvinyl pyrrolidone, a water-soluble cellulose derivative, and poly(meth)acrylonitrile.

An acid-modified polyvinyl alcohol having a carboxy group or a sulfo group is preferably used as the modified polyvinyl alcohol. Specific examples include modified polyvinyl alcohol described in JP-A No. 2005-250216 and JP-A No. 2006-259137.

The protective layer preferably contains an inorganic layered compound for the purpose of an enhancement in oxygen blocking properties. The inorganic layered compound is a particle having a thin plate shape, and examples include a mica group such as natural mica or synthetic mica, talc represented by Formula $3MgO.4SiO.H_2O$, taeniolite, montmorillonite, saponite, hectorite, and zirconium phosphate.

An inorganic layered compound preferably used is a mica compound. Examples of the mica compound include a mica group such as natural mica or synthetic mica represented by Formula A $(B,C)_{2-5}D_4O_{10}$ $(OH,F,O)_2$ [wherein A represents any of K, Na, or Ca, B and C each represent any of Fe (II), Fe (III), Mn, Al, Mg, or V, and D represents any of Si or Al.].

Examples of the mica group, for example, natural mica include white mica, soda mica, gold mica, black mica, and scale mica. Examples of the synthetic mica include non-swellable mica such as fluorine gold mica $KMg_3(AlSi_3O_{10})F_2$ or potassium tetrasilicon mica $(KMg_{2.5}Si_4O_{10})F_2$, and swellable mica such as Na tetrasililic mica $NaMg_{2.5}(Si_4O_{10})F_2$, Na or Li taeniolite $(Na,Li)Mg_2 Li(Si_4O_{10})F_2$, or montmorillonite-type Na or Li hectorite $(Na,Li)_{1/8}Mg_{2/5} Li_{1/8}(Si_4O_{10})F_2$. Furthermore, synthetic smectite is also useful.

Fluorine-based swellable mica is particularly useful among the above mica compounds. That is, the swellable synthetic mica has a stacked structure made of a unit crystal lattice layer having a thickness of from 10□ to 15□ (1□=0.1 nm), and is remarkably larger in interlattice metal atom substitution than other clay mineral. As a result, a lattice layer is caused to be insufficient in positive charge, and a positive ion such as $Li^+$, $Na^+$, $Ca^{2+}$, or $Mg^{2+}$ for compensating such a charge adsorbs between layers. Such a positive ion interposed between layers is called an exchangeable positive ion, and can be exchanged with any of various positive ions. In particular, in a case in which the positive ion between layers is $Li^+$ or $Na^+$, the ion radius thereof is small to thereby cause a weak bond between layered crystal lattices, resulting in significant swelling due to water. A shearing force is applied in such a state to thereby easily allow for cleaving, resulting in formation of stable sol in water. The swellable synthetic mica strongly tends to behave in such a manner, and thus is particularly preferably used.

The mica compound more preferably has a shape thinner in thickness from the viewpoint of control of diffusion, and more preferably has a flat surface larger in size as long as smoothness of a surface coated or permeability of actinic rays is not impaired. Accordingly, the aspect ratio is preferably 20 or more, more preferably 100 or more, particularly preferably 200 or more. The aspect ratio means the ratio of the longer size to the thickness of the particle, and can be measured based on, for example, a projection view with a micrograph of the particle. A larger aspect ratio imparts a larger effect obtained.

The particle size of the mica compound is preferably from 0.3 Lam to 20 ram, more preferably from 0.5 µm to 10 µm, particularly preferably from 1 µm to 5 µm in terms of the average longer size. The average thickness of the particle is preferably 0.1 µm or less, more preferably 0.05 µm or less, particularly preferably 0.01 µm or less. Specifically, for example, the swellable synthetic mica as a representative compound has a thickness of about from 1 nm to 50 nm and a surface size (longer size) of about from 1 µm to 20 µm in a preferable aspect.

The content of the inorganic layered compound is preferably from 1% by mass to 60% by mass, more preferably from 3% by mass to 50% by mass with respect to the total solid content of the protective layer. Even in the case of combination use of a plurality of the inorganic layered compounds, the total amount of the inorganic layered compounds preferably corresponds to the above content. Such a range allows for an enhancement in oxygen blocking properties, whereby favorable sensitivity is obtained. Deterioration in inking properties can also be prevented.

The protective layer may contain known additive(s) such as a plasticizer for imparting flexibility, a surfactant for an enhancement in coatability, and/or an inorganic particle for control of surface slippability. The protective layer may contain the oil-sensitizing agent described with respect to the image recording layer.

The protective layer is applied according to a known method. The amount (solid content) of coating of the protective layer is preferably from 0.01 $g/m^2$ to 10 $g/m^2$, more preferably from 0.02 $g/m^2$ to 3 $g/m^2$, particularly preferably from 0.02 $g/m^2$ to 1 $g/m^2$.

(Method of Preparing Lithographic Printing Plate)

The lithographic printing plate precursor according to the disclosure can be prepared by performing image exposure and a development treatment.

The method of preparing a lithographic printing plate according to the disclosure preferably includes a step of imagewise exposing the lithographic printing plate precursor according to the disclosure, thereby forming an exposed portion and an unexposed portion (hereinafter, also referred to as "exposing step"), and a step of feeding at least one of printing ink or dampening water, thereby removing the unexposed portion (hereinafter, also referred to as "on-press development step".) in the listed order.

The method of preparing a lithographic printing plate according to the disclosure preferably includes a step of image-exposing the lithographic printing plate precursor according to the disclosure, including the polymerization initiator and the polymerizable compound, by laser, and a step of removing an unexposed portion of the image recording layer by a one-bath developer having a pH of from 2 to 11.

Hereinafter, preferable aspects of respective steps in the method of preparing a lithographic printing plate according to the disclosure, and the lithographic printing method according to the disclosure will be sequentially described. The lithographic printing plate precursor according to the disclosure can also be developed by a developer.

<Exposing Step>

The method of preparing a lithographic printing plate according to the disclosure preferably includes an exposing step of imagewise exposing the lithographic printing plate precursor according to the disclosure, thereby forming an exposed portion and an unexposed portion. The lithographic printing plate precursor according to the disclosure is preferably exposed by laser through a transparent original drawing having a line image, a halftone dot image, and the like, or imagewise exposed by laser beam scanning or the like with digital data.

The wavelength of a light source, preferably used, is from 750 nm to 1,400 nm. A light source of from 750 nm to 1,400 nm is suitably a solid-state laser or a semiconductor laser that emits infrared rays. The infrared laser preferably has an output of 100 mW or more, is preferably applied for an exposure time per pixel of 20 microseconds or less, and is preferably applied in an amount of energy radiated, of from 10 $mJ/cm^2$ to 300 $mJ/cm^2$. A multibeam laser device for shortening the exposure time is preferably used. The exposure mechanism may be any of an internal surface drum system, an external surface drum system, or a flat head system, for example.

The image-exposing can be performed using a plate setter or the like according to an ordinary method. In the case of on-press development, the image-exposing may be performed on a printer after the lithographic printing plate precursor is mounted on a printer.

<On-Press Development Step>

The method of preparing a lithographic printing plate according to the disclosure preferably includes an on-press development step of feeding at least one of printing ink or dampening water, and removing the unexposed portion.

The method of preparing a lithographic printing plate according to the disclosure may be performed according to a method where development is made by a developer (developer treatment method).

Hereinafter, an on-press development method will be described.

—On-Press Development Method—

An on-press development method preferably allows a lithographic printing plate precursor image-exposed to be used to thereby prepare a lithographic printing plate by feeding oil-based ink and an aqueous component on a printer and removing an image forming layer in a non-image area.

That is, a lithographic printing plate precursor is image-exposed and then mounted to a printer as it is without any development treatment performed, or a lithographic printing plate precursor is mounted to a printer and then image-exposed on the printer, and thereafter oil-based ink and an aqueous component are fed for printing, whereby an uncured image forming layer is dissolved or dispersed in any one of or both the oil-based ink and the aqueous component fed, in a non-image area, and thus removed, at the initial stage during the printing, and a hydrophilic surface is exposed on the area. In this regard, an image forming layer cured by exposure forms an oil-based ink-receiving area having a lipophilic surface, in an exposed portion. While the oil-based ink or the aqueous component may be first fed to a plate surface, the oil-based ink is preferably first fed from the viewpoint of prevention of contamination due to any component of the image forming layer from which the aqueous component is removed. Thus, the lithographic printing plate precursor is subjected to on-press development on a printer, and is used as it is in printing for multiple sheets. The oil-based ink and the aqueous component suitably used are general printing ink and dampening water for lithographic printing, respectively.

The wavelength of a light source for use as a laser for image exposure of the lithographic printing plate precursor according to the disclosure, including the polymerization initiator and the polymerizable compound, is preferably from 300 nm to 450 nm or from 750 nm to 1,400 nm. In the case of a light source of from 300 nm to 450 nm, a lithographic printing plate precursor containing a sensitizing dye having an absorption maximum in the wavelength region, in an image recording layer, is preferably used, and the above light source is preferably used for a light source of from 750 to 1,400 nm. The light source of from 300 nm to 450 nm is suitably a semiconductor laser.

The one-bath developer having a pH of from 2 to 11, which can be used, is a known developer, and examples include a developer having a pH of from 2 to 11, containing at least one of a surfactant or a water-soluble polymer compound. A conventional development treatment with a strongly alkaline developer has been needed to include removal of a protective layer in a pre-water washing step, thereafter alkali development, removal of alkali by water-washing in a post-water washing step, a gum liquid treatment, and drying in a drying step. The developer containing a surfactant or a water-soluble polymer compound can be used to thereby perform development and a gum liquid treatment at the same time. Accordingly, no post-water washing step is particularly needed, and development and a gum liquid treatment can be performed with one liquid and thereafter a drying step can be performed. Furthermore, no pre-water washing step is also particularly needed because removal of a protective layer can also be performed at the same time as development and a gum liquid treatment. The drying is preferably performed after such a development treatment and then removal of an excess of a developer by use of a squeeze roller or the like.

<Printing Step>

The lithographic printing method according to the disclosure includes a printing step of feeding printing ink to the lithographic printing plate subjected to on-press development in the on-press development step, thereby performing printing on a recording medium.

The printing ink is not particularly limited, and any of various known inks can be used when appropriate. Examples of the printing ink preferably include oil-based ink or UV curable ink (UV ink), and more preferably include UV ink.

Dampening water may be, if necessary, fed in the printing step.

The printing step may be performed successively to the on-press development step without stopping of the printer.

The recording medium is not particularly limited, and a known recording medium can be used when appropriate.

The method of preparing a lithographic printing plate from the lithographic printing plate precursor according to the disclosure, and the lithographic printing method according to the disclosure may include, if necessary, heating the entire surface of the lithographic printing plate precursor before exposure, in exposure, or between exposure and development. Such heating can allow an image forming reaction in the image forming layer to be promoted, resulting in the advantages of enhancements in sensitivity and printing durability, and stabilization of sensitivity, for example. The heating before development is preferably performed in a mild condition of 150° C. or less. The aspect can allow for prevention of the problem of, for example, curing of a non-image area. The heating after development is preferably performed in an extremely strong condition of a range of preferably from 100° C. to 500° C. Such a range can allow a sufficient image-strengthening action to be obtained, resulting in suppression of the problems of deterioration of the support and thermal decomposition of the image area.

EXAMPLES

Hereinafter, the present embodiment will be described in detail with reference to examples, but the embodiment is not limited thereto these. The molecular weight of any polymer compound means a weight average molecular weight (Mw) as a polystyrene conversion value according to a gel permeation chromatography (GPC) method, and the rate of a repeating unit thereof means a molar percentage, unless particularly specified. In addition, "part(s)" and "%" indicate "part(s) by mass" and "% by mass", respectively, unless otherwise specified.

A synthesis example of a compound represented by Formula 1 is described below. Other compound represented by Formula 1 can also be synthesized in the same manner with raw materials and a reaction intermediate being appropriately changed.

A compound represented by Formula 1, a mother nucleus structure A-1 and the like, and a counter anion B-1 and the like, used in Examples, each have the same structure as described above.

Examples 1 to 33 and Comparative Examples 1 to 13

1. Preparation of Lithographic Printing Plate Precursor A
<Preparation of Support>

After the surface of an aluminum plate (material JIS A 1050) having a thickness of 0.3 mm was subjected to a degreasing treatment with an aqueous 10% by mass soda aluminate solution at 50° C. for 30 seconds, for removal of rolling oil on the surface, the surface of an aluminum plate was grained using three bristle bundle nylon brushes having a bristle diameter of 0.3 mm and a pamis-water suspension having a median size of 25 μm (specific gravity 1.1 g/cm³), and well washed with water. The aluminum plate was immersed in an aqueous 25% by mass sodium hydroxide solution at 45° C. for 9 seconds and thus etched, washed with water, thereafter further immersed in an aqueous 20% by mass nitric acid solution at 60° C. for 20 seconds, and washed with water. The amount of etching of the surface grained was about 3 g/m².

Next, an electrochemical surface roughening treatment was continuously performed by use of an AC voltage of 60 Hz. An electrolyte was an aqueous 1% by mass nitric acid solution (containing 0.5% by mass of an aluminum ion), and the temperature thereof was 50° C. The AC power supply used was a trapezoidal rectangular waveform AC having a time TP until the current value reached a peak from zero, of 0.8 msec, and having a duty ratio of 1:1, and the electrochemical surface roughening treatment was performed with a carbon electrode as a counter electrode. Ferrite was used as an auxiliary anode. The current density was 30 A/dm² as the peak current value, and 5% of the current flowing from the power source was allowed to separately flow into an auxiliary anode. The electric quantity in electrolysis with nitric acid was an electric quantity of 175 C/dm² at the time of anodization of the aluminum plate. Thereafter, the resultant was spray-washed with water.

Subsequently, the electrochemical surface roughening treatment was performed according to the same method as in electrolysis with nitric acid in conditions of an aqueous 0.5% by mass hydrochloric acid solution (containing 0.5% by mass of an aluminum ion) at a temperature of 50° C., as an electrolyte, and an electric quantity of 50 C/dm² at the time of anodization of the aluminum plate, and thereafter the resultant was spray-washed with water.

Next, 2.5 g/m² of a DC-anodized film was formed on the aluminum plate with an aqueous 15% by mass sulfuric acid solution (containing 0.5% by mass of an aluminum ion) as an electrolyte at a current density of 15 A/dm², and thereafter washed with water and dried, thereby produce a support A. The average pore size (surface average pore size) on the surface layer of the anodized film was 10 nm.

The pore size on the surface layer of the anodized film was measured according to a method including observing the surface at a magnification of 150,000 at a relatively low acceleration voltage of 12 V with an ultrahigh resolution SEM (Hitachi S-900) without any vapor deposition treatment for imparting conductivity, and randomly extracting 50 pores and determining the average value. The standard deviation error was within ±10%.

Thereafter, the support A was subjected to a silicate treatment with an aqueous 2.5% by mass No. 3 sodium silicate solution at 60° C. for 10 seconds in order to ensure hydrophilicity of a non-image area, and thereafter washed with water, thereby producing a support B. The amount of Si attached was 10 mg/m². The center line average roughness (Ra) of the support B was measured with a needle having a diameter of 2 μm, and was 0.51 μm.

A support C was prepared according to the production method as in the support A except that the electrolyte in formation of the DC-anodized film was changed to an aqueous 22% by mass phosphoric acid solution in preparation of the support A. The average pore size (surface average pore size) on the surface layer of the anodized film was measured according to the same method, and was 25 nm.

Thereafter, the support C was subjected to a silicate treatment with an aqueous 2.5% by mass No. 3 sodium silicate solution at 60° C. for 10 seconds in order to ensure hydrophilicity of a non-image area, thereby producing a support D. The amount of Si attached was 10 mg/m². The center line average roughness (Ra) of the support D was measured with a needle having a diameter of 2 μm, and was 0.52 μm.

<Formation of Undercoat Layer>

Each support represented in Table 1 to Table 3 below was coated with a coating solution (1) for an undercoat layer, having the following composition, so that the amount of coating after drying was 23 mg/m², thereby forming an undercoat layer.

<Coating Solution (1) for Undercoat Layer>
Polymer (P-1) [the following structure]: 0.18 parts
Hydroxyethyliminodiacetic acid: 0.10 parts
Water: 61.4 parts

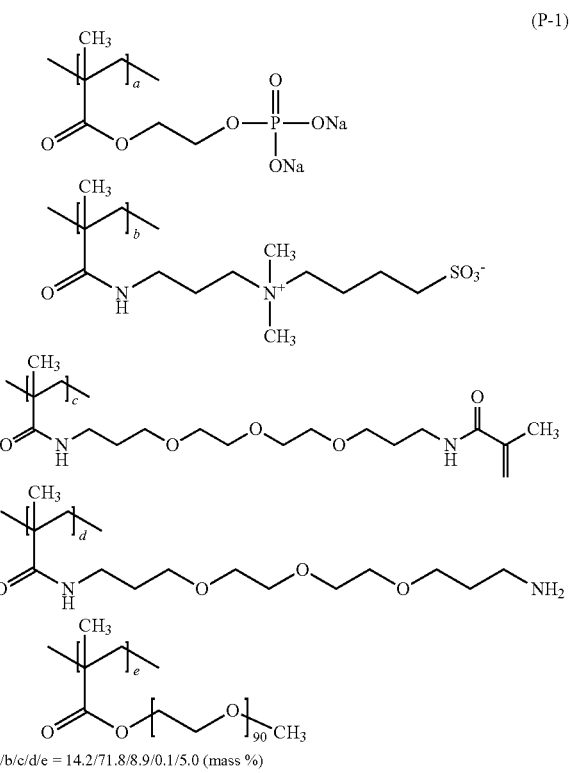

a/b/c/d/e = 14.2/71.8/8.9/0.1/5.0 (mass %)
a/b/c/d/e = 19.0/72.8/7.7/0.1/0.4 (mol %)
Weight average molecular weight = 200,000

The synthetic method of the polymer P-1 is described below.

(Synthesis of Monomer M-1)

To a 3-L three-necked flask were added 200 g (0.91 mol) of ANCAMINE 1922A (diethylene glycol di(aminopropyl) ether, manufactured by Air Products and Chemicals, Inc.), 435 g of distilled water and 410 g of methanol, and cooled to 5° C. Next, 222.5 g (1.82 mol) of benzoic acid and 25 mg (0.15 mmol) of 4-hydroxy-2,2,6,6-tetramethylpiperidin-1-oxyl (4-OH-TEMPO) were added, and 280 g (1.82 mmol) of methacrylic acid anhydride was dropped so that the internal temperature of a reaction liquid was 10° C. or less. The reaction liquid was stirred at 5° C. for 6 hours, and then stirred at 25° C. for 12 hours, and thereafter 70 g of phosphoric acid was added to adjust the pH to 3.3. The reaction liquid was transferred to a 10-L stainless beaker, and 3.7 L of ethyl acetate, 1.5 L of methyl-tert-butyl ether (MTBE) and 0.65 L of distilled water were added thereto, and vigorously stirred and thereafter left to still stand. After the upper layer (organic layer) was disposed, 1.8 L of ethyl acetate was added, vigorously stirred and thereafter left to still stand, and the upper layer was disposed. Furthermore, 1.5 L of ethyl acetate was added, vigorously stirred and thereafter left to still stand, and the upper layer was disposed. Next, 1.6 L of MTBE was added, vigorously stirred and thereafter left to still stand, and the upper layer was disposed. To the resulting aqueous solution was added 62.5 mg (0.36 mmol) of 4-OH-TEMPO, thereby providing 1.2 kg of an aqueous monomer M-1 solution (20.1% by mass, converted to the solid content).

(Purification of Monomer M-2)

To a separatory funnel were added 420 g of LIGHT-ESTER P-1M (2-methacryloyloxyethyl acid phosphate, manufactured by Kyoeisha Chemical Co., Ltd.), 1,050 g of diethylene glycol dibutyl ether and 1,050 g of distilled water, and vigorously stirred and thereafter left to still stand. After the upper layer was disposed, 1050 g of diethylene glycol dibutyl ether was added, and the resultant was vigorously stirred and thereafter left to still stand. The upper layer was disposed, thereby providing 1.3 kg of an aqueous monomer M-2 solution (10.5% by mass, converted to the solid content).

(Synthesis of Polymer P-1)

To a 3-L three-necked flask were added 600.6 g of distilled water, 33.1 g of an aqueous monomer M-1 solution and 46.1 g of the following monomer M-3, and heated to 55° C. in a nitrogen atmosphere. Next, a dropping liquid A represented below was dropped over 2 hours and stirred for 30 minutes, thereafter 3.9 g of VA-046B (manufactured by FUJI FILM Wako Pure Chemical Corporation) was added thereto, and the resultant was heated to 80° C. and stirred for 1.5 hours. The reaction liquid was cooled to room temperature (25° C., the same hereinafter), and thereafter 175 g of an aqueous 30% by mass sodium hydroxide solution was added to thereby adjust the pH to 8.3. Next, 152.2 mg of 4-OH-TEMPO was added, and the resultant was heated to 53° C. Added was 66.0 g of methacrylic acid anhydride, and stirred at 53° C. for 3 hours. After the resultant was cooled to room temperature, the reaction liquid was transferred to a 10-L stainless beaker, 1,800 g of MTBE was added thereto, and vigorously stirred and thereafter left to still stand, and the upper layer was disposed. After the same washing operation with 1,800 g with MTBE was further repeated twice, 1,700 g of distilled water and 212 mg of 4-OH-TEMPO were added to the resulting aqueous layer, thereby providing 4.1 kg of a polymer P-1 (11.0%, converted to the solid content) as a uniform solution. The weight average molecular weight (Mw) as a polyethylene glycol conversion value by a gel permeation chromatography (GPC) method was 200000.

—Dropping Liquid A—

Aqueous monomer M-1 solution above: 132.4 g

Aqueous monomer M-2 solution above: 376.9 g

Monomer M-3 [the following structure]: 184.3 g

Blemmer PME4000 (manufactured by NOF CORPORATION): 15.3 g

VA-046B (manufactured by FUJIFILM Wako Pure Chemical Corporation): 3.9 g

Distilled water: 717.4 g

Blemmer PME 4000: methoxy polyethylene glycol methacrylate (repetition number of oxyethyl ene unit: 90)

VA-046B: 2,2'-azobis[2-(2-imidazolin-2-yl)propane]disulfate dihydrate

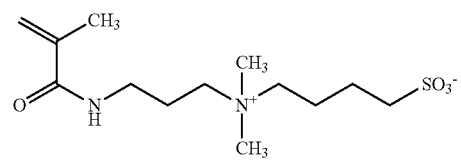

Monomer M-3

<Formation of Image Recording Layer>

The undercoat layer was bar coated with a coating solution (1) for an image recording layer, having the following composition, and dried in an oven at 120° C. for 40 seconds, thereby forming an image recording layer in an amount of coating after drying of 1.0 g/m².

The coating solution (1) for an image recording layer was prepared immediately before the coating, by mixing and stirring the following sensitizer (1) and a microgel liquid.

—Sensitizer (1)—

Binder polymer (1) [the following structure]: 0.125 parts

Electron-accepting polymerization initiator [the following structure]: 0.132 parts Compound represented by Formula 1 or comparative compound (infrared absorbent) described in Table 1 to Table 3: 0.033 parts Electron-donating polymerization initiator [the following structure]: 0.057 parts Acid color former [the following structure]: 0.058 parts Polymerizable compound U-15HA (urethane acrylate, manufactured by Shin-Nakamura Chemical Co., Ltd.): 0.146 parts ATM-4E (ethoxylated pentaerythritol tetraacrylate, manufactured by Shin-Nakamura Chemical Co., Ltd.): 0.078 parts Polymeric hydrophilic compound Hydroxypropylcellulose (HPC-SSL, manufactured by Nippon Soda Co., Ltd.): 0.030 parts Low-molecular-weight hydrophilic compound (tris(2-hydroxyethyl) isocyanurate): 0.020 parts Fluorine-based surfactant (1) [the following structure]: 0.008 parts 2-Butanone: 1.091 parts 1-Methoxy-2-propanol: 8.609 parts —Microgel Liquid—

Microgel (1): 1.64 parts

Distilled water: 2.425 parts

The structures of the binder polymer (1), the electron-accepting polymerization initiator, the electron-donating polymerization initiator and the fluorine-based surfactant (1) used in the sensitizer (1) structure are represented below.

Binder polymer (1)
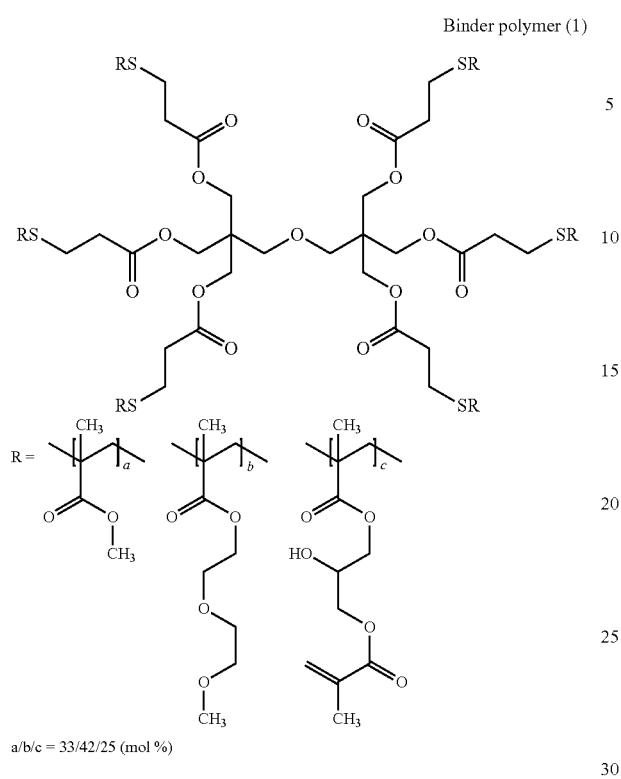
a/b/c = 33/42/25 (mol %)
Electron-Donating Polymerization Initiators I-1 to I-4 (the Following Compounds)
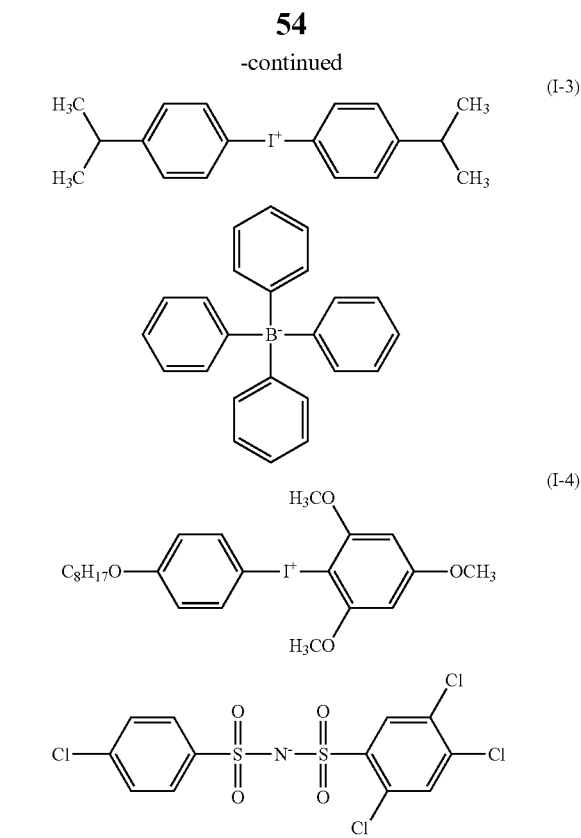
Electron-Donating Polymerization Initiators D-1 to D-4 (the Following Compounds)
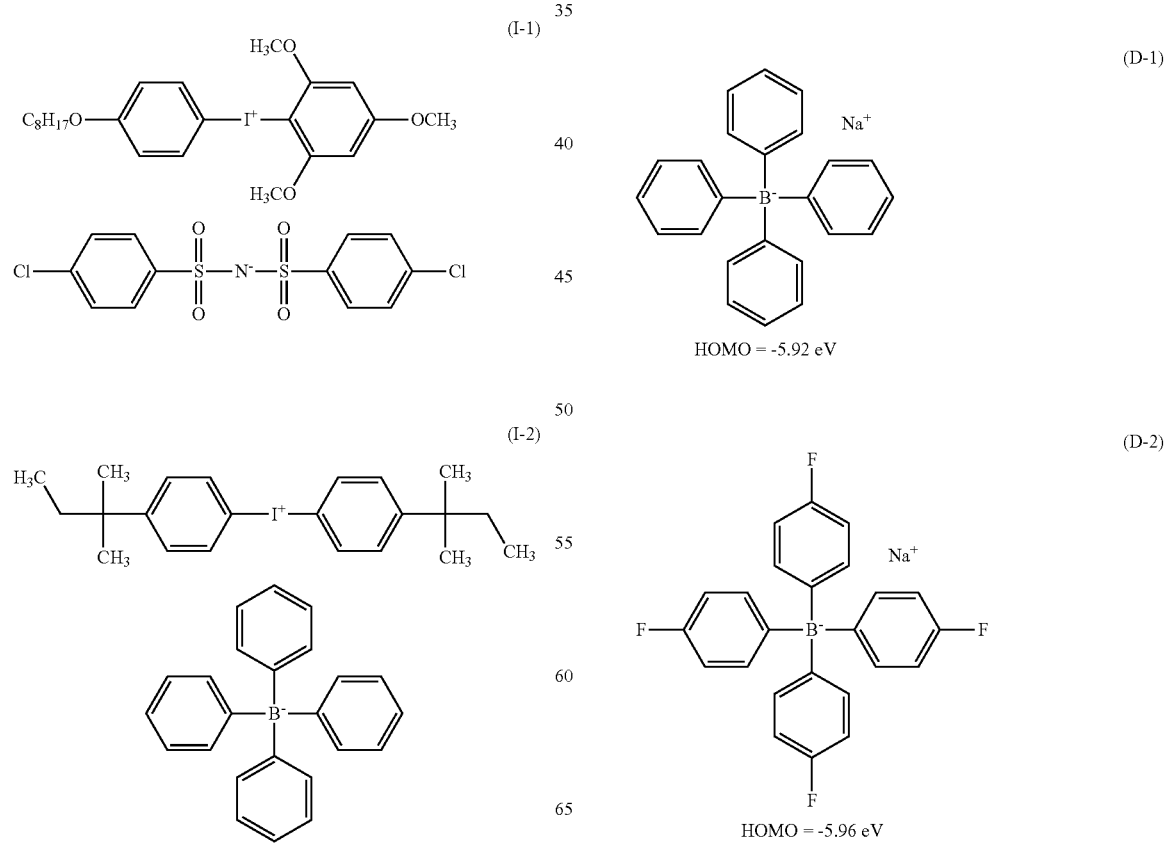

(D-3)
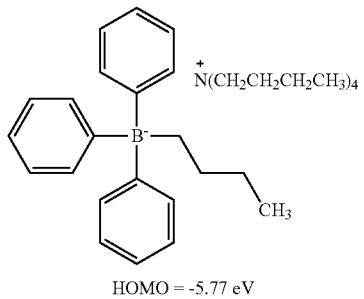
HOMO = −5.77 eV
(D-4)
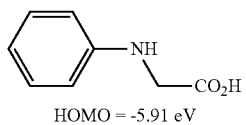
HOMO = −5.91 eV
Acid Generators CL-1 to CL-4 (the Following Compounds)
(CL-1)
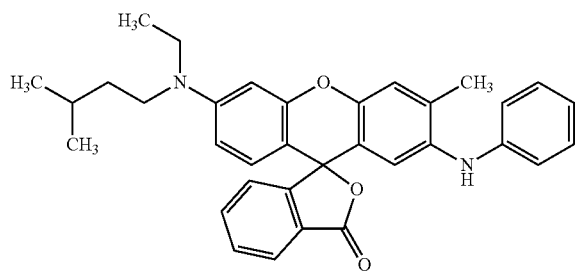
(CL-2)
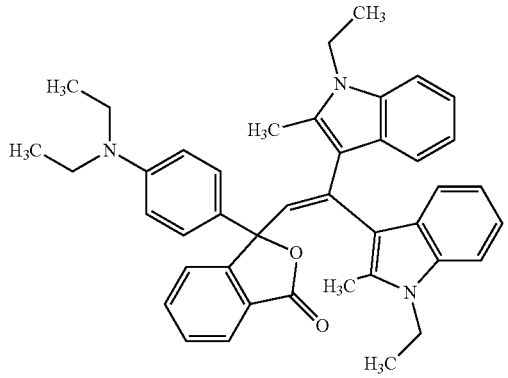
(CL-3)
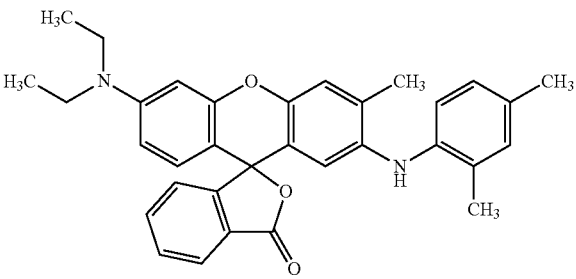
(CL-4)
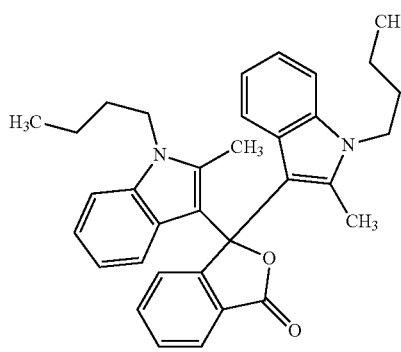
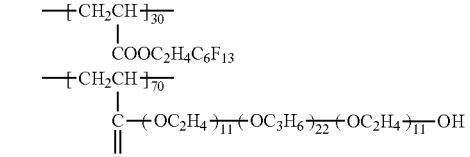
Fluorine-based surfactant (1) (Mw = 13,000)
Comparative Coloring Agent Compounds A'-1 to A'-7 (the Following Compounds)
A'-1
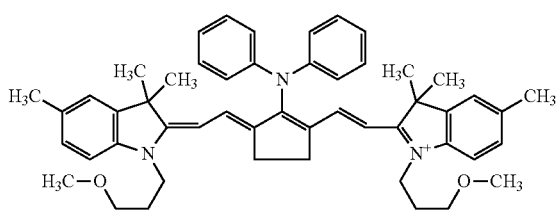
HOMO = −5.27 eV -continued

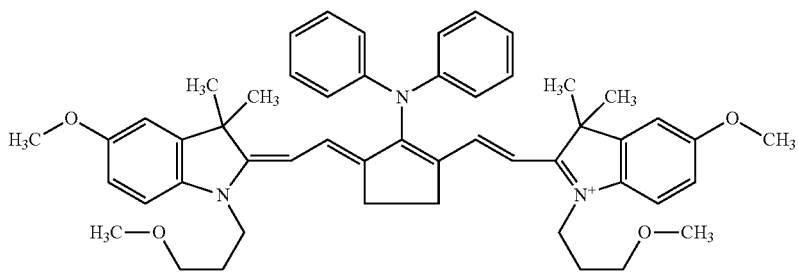
HOMO = -5.18 eV
A'-2

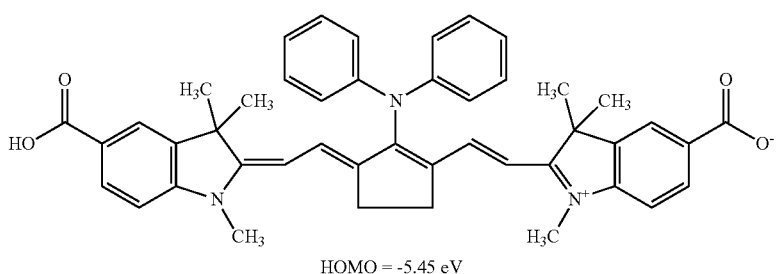
HOMO = -5.45 eV
A'-3

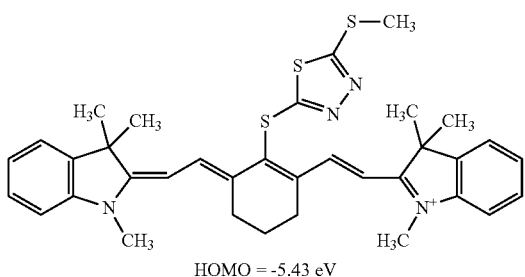
HOMO = -5.43 eV
A'-4

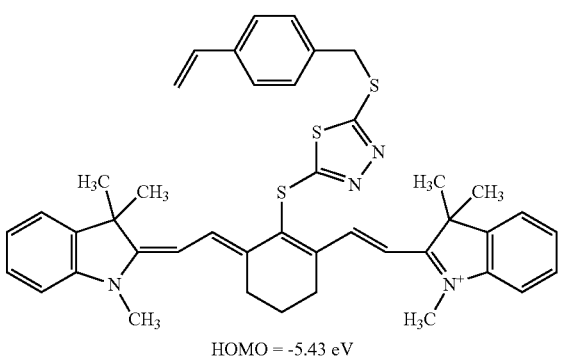
HOMO = -5.43 eV
A'-5

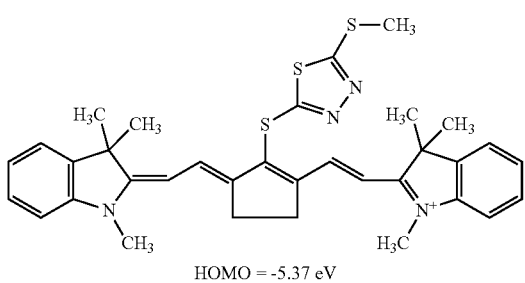
HOMO = -5.37 eV
A'-6

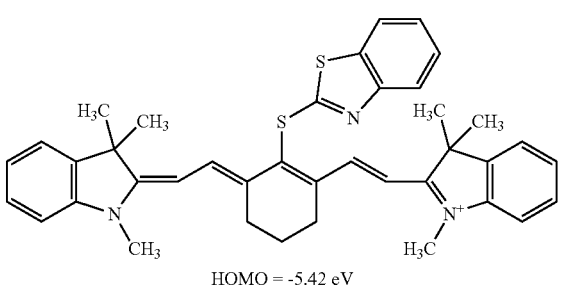
HOMO = -5.42 eV
A'-7

The method of adjusting the binder polymer (1) is represented below.

To a 1-L three-necked flask was added 78 g of 1-methoxy-2-propanol, and the temperature was set to 70° C. in a nitrogen stream. The following dropping liquid 1 was dropped thereto over 2.5 hours, and heated to 80° C. and stirred for 2 hours after completion of the dropping. The following addition liquid 1 was further added and heated to 90° C., and stirred for 2.5 hours.

—Dropping Liquid 1—
Methyl methacrylate: 21.8 g
Blemmer PME 100: 52.1 g
Methacrylic acid: 14.2 g
Dipentaerythritol hexakis(3-mercaptopropionate): 2.15 g
V-601 (manufactured by FUJIFILM Wako Pure Chemical Corporation): 0.38 g
1-Methoxy-2-propanol: 50.2 g
—Addition Liquid 1—
V-601 (dimethyl 2,2'-azobis(2-methylpropionate), manufactured by FUJIFILM Wako Pure Chemical Corporation): 0.038 g
1-Methoxy-2-propanol: 4.0 g The reaction liquid was cooled to 25° C., 136.6 g of 1-methoxy-2-propanol, 0.238 g of 4-OH-TEMPO, 25.88 g of glycidyl methacrylate, and 2.957 g of trimethylbenzylammonium bromide were added thereto, and the resultant was stirred at 90° C. for 18 hours. The resulting solution was cooled to room temperature, and diluted with 1-methoxy-2-propanol so as to have a solid content concentration of 23%, thereby providing a binder polymer (1). The weight average molecular weight (Mw) as a polystyrene conversion value according to a gel permeation chromatography (GPC) method was 40000.

The method of preparing the microgel (1) used in the microgel liquid was represented below.

<Preparation of Polyvalent Isocyanate Compound (1)>

To a suspended solution of 17.78 g (80 mmol) of isophorone diisocyanate and 7.35 g (20 mmol) of the following polyhydric phenol compound (1) in ethyl acetate (25.31 g) was added 43 mg of bismuth tris(2-ethylhexanoate) (NEOSTANN U-600, manufactured by Nitto Kasei Co., Ltd.), and the resultant was stirred. The reaction temperature was set to 50° C. at the time of convergence of heat generation, and stirring was made for 3 hours, thereby providing a solution of a polyvalent isocyanate compound (1) in ethyl acetate (50% by mass).

<Preparation of Microgel (1)>

The following oil phase component and aqueous phase component were mixed, and emulsified with a homogenizer at 12,000 rpm for 10 minutes. After the resulting emulsified product was stirred at 45° C. for 4 hours, 5.20 g of an aqueous 10% by mass 1,8-diazabicyclo[5.4.0]undeca-7-ene-octylate (U-CAT SA102, manufactured by San-Apro Ltd.) solution was added, and the resultant was stirred at room temperature for 30 minutes and left to still stand at 45° C. for 24 hours. The solid content concentration was adjusted with distilled water so as to be 20% by mass, thereby providing an aqueous dispersion liquid of the microgel (1). The average particle size was measured according to a light scattering method, and was 0.28 nm.

—Oil Phase Component—

(Component 1) ethyl acetate: 12.0 g (Component 2) adduct (50% by mass ethyl acetate solution, manufactured by Mitsui Chemicals, Inc.) obtained by adding trimethylolpropane (6 mol) and xylene diisocyanate (18 mol), and adding methylene terminal polyoxyethylene (1 mol, repetition number of oxyethylene unit: 90) thereto: 3.76 g (Component 3) polyvalent isocyanate compound (1) (as a 50% by mass ethyl acetate solution): 15.0 g (Component 4) solution of 65% by mass dipentaerythritol pentaacrylate (SR-399, manufactured by Sartomer) in ethyl acetate: 11.54 g (Component 5) solution of 10% sulfonate type surfactant (Pionin A-41-C, manufactured by TAKEMOTO OIL & FAT Co., Ltd.) in ethyl acetate: 4.42 g —Aqueous Phase Component—

Distilled water: 46.87 g

<Formation of Protective Layer>

The image recording layer was bar coated with a coating solution for a protective layer, having the following composition, and dried in an oven at 120° C. for 60 seconds, thereby forming a protective layer in an amount of coating after drying of 0.15 g/m$^2$, thereby preparing each lithographic printing plate precursor for Examples 1 to 8 and Comparative Examples 1 to 4. The support used in preparation of each lithographic printing plate precursor, and the compound represented by Formula 1 or comparative compound in the coating solution (1) for an image recording layer are collectively described in Table 1.

—Coating Solution for Protective Layer—

Inorganic layered compound dispersion liquid (1) [described below]: 1.5 parts

Aqueous 6% by mass polyvinyl alcohol (CKS50, manufactured by Synthetic Chemical Industry Co., Ltd., sulfonic acid-modified, a degree of saponification of 99% by mol or more, a degree of polymerization of 300) solution: 0.55 parts Aqueous 6% by mass polyvinyl alcohol (PVA-405, manufactured by Kuraray Co., Ltd., a degree of saponification of 81.5% by mol, a degree of polymerization of 500) solution: 0.03 parts Aqueous 1% by mass surfactant (polyoxyethylene lauryl ether, EMALEX 710, manufactured by Nihon Emulsion Co., Ltd.) solution: 0.86 parts Ion exchange water: 6.0 parts The method of preparing the inorganic layered compound dispersion liquid (1) used in the coating solution for a protective layer is represented below.

<Preparation of Inorganic Layered Compound Dispersion Liquid (1)>

To 193.6 parts of ion exchange water was added 6.4 parts of synthetic mica (SOMASIF ME-100, manufactured by Co-op Chemical Co., Ltd.), and dispersed with a homogenizer until the average particle size (laser scattering method) was 3 µm. The aspect ratio of the resulting dispersed particle was 100 or more.

2. Preparation of Lithographic Printing Plate Precursor B

Each lithographic printing plate precursor B for Examples 9 to 33 and Comparative Examples 5 to 14 was prepared in the same manner as in Preparation of lithographic printing plate precursor A except that no coating of any protective layer was made in Preparation of lithographic printing plate precursor A.

The support used in preparation of each lithographic printing plate precursor, and the compound represented by Formula 1 or comparative compound in the coating solution (1) for an image recording layer are collectively described in Table 2 and Table 3.

3. Evaluation of Lithographic Printing Plate Precursor

Each lithographic printing plate precursor described above was evaluated with respect to the color formability, on-press developability, printing durability and aging stability, as follows. The evaluation results are represented in Table 1 to Table 3.

(1) Color Formability

The lithographic printing plate precursor was exposed in conditions of an output of 11.5 W, an external surface drum rotation speed of 220 rpm, and a resolution of 2,400 dpi (dot per inch, 1 inch=25.4 mm) with Trendsetter 3244VX (manufactured by Creo Co., Ltd.) equipped with a water-cooling system 40 W infrared semiconductor laser. The exposure was performed in an environment of 25° C. and 50% RH.

The color development of the lithographic printing plate precursor was measured immediately after the exposure and after storage in a dark place (25° C.) for 2 hours after the exposure. The measurement was performed in a SCE (Specular Component Exclude) system with Spectro Colorimeter CM 2600d and operation software CM-S100 W manufactured by KONICA MINOLTA JAPAN, INC. The color formability was evaluated using the L* value (lightness) of the L*a*b* color coordinate system according to the difference ΔL between the L* value of an exposed portion and the L* value of an unexposed portion. A larger ΔL value means more excellent color formability.

(2) On-Press Developability

The lithographic printing plate precursor was exposed by Luxel PLATESETTER T-6000III manufactured by FUJIFILM Corporation, equipped with an infrared semiconductor laser, in conditions of an external surface drum rotation speed of 750 rpm, a laser output of 70%, and a resolution of 2,400 dpi. The exposed image included a solid image and 50% halftone dot of 20-μm-dot FM screen.

The lithographic printing plate precursor exposed was mounted to a plate cylinder of a printer LITHRONE 26 manufactured by Komori Corporation, without any development treatment. Dampening water of Ecolity-2 (manufactured by FUJIFILM Corporation)/tap water=2/98 (volume ratio) and Values-G(N) solid ink (manufactured by DIC Graphics Corporation) were used, the dampening water and the ink were fed according to a standard automatic printing method of LITHRONE 26, and printing was performed on paper of Tokubishi Art (76.5 kg) (manufactured by Mitsubishi Paper Mills Limited) for 100 sheets at a printing speed of 10,000 sheets per hour.

The number of sheets required for the completion of on-press development of the unexposed portion of the image recording layer on the printer and no transferring of any ink onto the non-image area was determined, and evaluated as the on-press developability. A smaller number of sheets means more favorable on-press developability.

(3) Printing Durability to Oil-Based Ink

After the on-press developability was evaluated, printing was further continued. The density of ink on a print was reduced because of gradual wearing of the image recording layer according to an increase in the number of printed sheets. The number of printed sheets until the halftone dot area rate of a 50% halftone dot of an FM screen on the print, as measured with a Gretag densitometer (manufactured by GretagMacbeth Company), was reduced by 5% as compared with such a rate measured on the 100th printed sheet was determined. The printing durability was evaluated with relative printing durability where a number of printed sheets, of 50000, was defined as 100. A larger numerical value means more favorable printing durability.

Relative printing durability=(Number of printed sheets with objective lithographic printing plate precursor)/50,000×100

(4) Printing Durability to UV Curable Ink (UV Ink)

The lithographic printing plate precursor was exposed by Luxel PLATESETTER T-6000III manufactured by FUJIFILM Corporation, equipped with an infrared semiconductor laser, in conditions of an external surface drum rotation speed of 750 rpm, a laser output of 70%, and a resolution of 2,400 dpi. The exposed image included a solid image and 50% halftone dot of 20-μm-dot FM screen.

The resulting plate precursor exposed was mounted to a cylinder of a printer SX-74 manufactured by Heidelberger Druckmaschinen AG having a Kikuban size of (636 mm×939 mm), without any development treatment. To the printer was connected a dampening water circulating tank having a volume of 100 L, where a non-woven filter and a temperature controlling apparatus were built in. A standard apparatus was charged with 80 L of dampening water including 2.0% of dampening water S-Z1 (manufactured by FUJIFILM Corporation), T&K UV OFS K-HS solid ink GE-M (manufactured by T&K TOKA Corporation) was used as printing ink and the dampening water and the ink were fed according to a standard automatic printing starting method, and thereafter printing was performed on paper of Tokubishi Art (76.5 kg) at a printing speed of 10,000 sheets per hour.

The density of ink on a print was reduced because of gradual wearing of the image recording layer according to an increase in the number of printed sheets. The number of printed sheets until the halftone dot area rate of a 50% halftone dot of an FM screen on the print, as measured with a Gretag densitometer, was reduced by 5% as compared with such a rate measured on the 100th printed sheet was determined. The printing durability was evaluated with relative printing durability where a number of printed sheets, of 50000, was defined as 100. A larger numerical value means more favorable printing durability.

Relative printing durability=(Number of printed sheets with objective lithographic printing plate precursor)/50,000×100

(5) Aging Stability

The coating solution (1) for an image recording layer, used for preparation of the lithographic printing plate precursors A and B, was warmed at 60° C. for one day, and the remaining rate of the compound represented by Formula 1 or comparative compound was measured by high-performance liquid chromatography (HPLC). The coating solution warmed at 60° C. for one day was used to prepare a lithographic printing plate precursor, and the aging stability was evaluated.

In the following Tables, ΔE represents the difference between the HOMO orbital energy level of any compound represented by Formula 1 or comparative compound used, and the HOMO orbital energy level of any electron-donating polymerization initiator.

TABLE 1

| | | Compound represented by Formula 1 and Comparative compound | | Electron-accepting | Electron-donating | | | Printing durability | | | On-press developability | Aging stability | |
|---|---|---|---|---|---|---|---|---|---|---|---|---|---|
| | Support | Type of mother nucleus structure | Counter anion (Za) | polymerization initiator | polymerization initiator | Acid color former | ΔE (ev) | Oil-based ink | UV ink | ΔL | (sheets) | Remaining rate (%) | ΔL |
| Example 1 | B | A-1 | B-2 | I-1 | D-1 | CL-1 | 0.55 | 95 | 82 | 5.6 | 12 | 97 | 4.3 |
| Example 2 | B | A-1 | B-5 | I-1 | D-1 | CL-1 | 0.55 | 94 | 83 | 5.5 | 12 | 98 | 4.3 |
| Example 3 | B | A-1 | B-7 | I-1 | D-1 | CL-1 | 0.55 | 94 | 83 | 5.6 | 12 | 97 | 4.4 |
| Example 4 | B | A-1 | B-8 | I-1 | D-1 | CL-1 | 0.55 | 95 | 83 | 5.5 | 12 | 96 | 4.3 |
| Example 5 | B | A-2 | B-7 | I-1 | D-1 | CL-1 | 0.57 | 96 | 83 | 5.6 | 12 | 96 | 4.4 |
| Example 6 | B | A-15 | B-7 | I-1 | D-1 | CL-1 | 0.59 | 92 | 81 | 5.6 | 12 | 98 | 4.3 |
| Example 7 | B | A-29 | B-7 | I-1 | D-1 | CL-1 | 0.47 | 96 | 84 | 5.6 | 12 | 95 | 4.2 |
| Example 8 | D | A-1 | B-2 | I-1 | D-1 | CL-1 | 0.55 | 103 | 88 | 5.6 | 12 | 97 | 4.3 |
| Comparative Example 1 | B | A'-1 | B-7 | I-1 | D-1 | CL-1 | 0.65 | 88 | 62 | 4.9 | 12 | 99 | 3.7 |

TABLE 1-continued

| | Support | Compound represented by Formula 1 and Comparative compound Type of mother nucleus structure | Counter anion (Za) | Electron-accepting polymerization initiator | Electron-donating polymerization initiator | Acid color former | ΔE (ev) | Printing durability Oil-based ink | UV ink | ΔL | On-press developability (sheets) | Aging stability Remaining rate (%) | ΔL |
|---|---|---|---|---|---|---|---|---|---|---|---|---|---|
| Comparative Example 2 | B | A'-2 | B-7 | I-1 | D-1 | CL-1 | 0.74 | 72 | 48 | 4.3 | 12 | 99 | 3.3 |
| Comparative Example 3 | B | A'-3 | — | I-1 | D-1 | CL-1 | 0.47 | 89 | 76 | 5.0 | 60 | 87 | 3.9 |
| Comparative Example 4 | B | A'-4 | B-5 | I-1 | D-1 | CL-1 | 0.49 | 88 | 79 | 5.0 | 15 | 90 | 1.5 |

TABLE 2

| | Support | Compound represented by Formula 1 and Comparative compound Type of mother nucleus | Counter anion (Za) | Electron-accepting polymerization initiator | Electron-donating polymerization initiator | Acid color former | ΔE (ev) | Printing durability Oil-based ink | UV ink | ΔL | On-press developability (sheets) | Aging stability Remaining rate (%) | ΔL |
|---|---|---|---|---|---|---|---|---|---|---|---|---|---|
| Example 9 | B | A-1 | B-2 | I-1 | D-1 | CL-1 | 0.55 | 95 | 75 | 5.6 | 15 | 97 | 4.4 |
| Example 10 | B | A-1 | B-3 | I-1 | D-1 | CL-1 | 0.55 | 94 | 76 | 5.7 | 15 | 97 | 4.5 |
| Example 11 | B | A-1 | B-7 | I-1 | D-1 | CL-1 | 0.55 | 95 | 78 | 5.6 | 15 | 97 | 4.4 |
| Example 12 | B | A-2 | B-7 | I-1 | D-1 | CL-1 | 0.57 | 94 | 77 | 5.6 | 15 | 96 | 4.5 |
| Example 13 | B | A-2 | B-8 | I-1 | D-1 | CL-1 | 0.57 | 95 | 77 | 5.6 | 15 | 97 | 4.6 |
| Example 14 | B | A-13 | B-8 | I-1 | D-1 | CL-1 | 0.47 | 91 | 72 | 5.3 | 15 | 91 | 4.0 |
| Example 15 | B | A-15 | B-5 | I-1 | D-1 | CL-1 | 0.59 | 93 | 74 | 5.4 | 15 | 99 | 4.3 |
| Example 16 | B | A-29 | B-8 | I-1 | D-1 | CL-1 | 0.47 | 97 | 80 | 5.9 | 15 | 94 | 4.6 |
| Example 17 | B | A-29 | B-7 | I-1 | D-2 | CL-1 | 0.51 | 91 | 71 | 5.2 | 15 | 94 | 4.2 |
| Example 18 | B | A-29 | B-2 | I-1 | D-1 | CL-2 | 0.47 | 95 | 77 | 5.2 | 15 | 95 | 4.7 |
| Example 19 | B | A-29 | B-2 | I-1 | D-1 | CL-3 | 0.47 | 94 | 76 | 5.2 | 15 | 95 | 4.6 |
| Example 20 | B | A-29 | B-2 | I-1 | D-1 | CL-4 | 0.47 | 95 | 77 | 5.3 | 15 | 95 | 4.5 |
| Example 21 | B | A-2 | B-8 | I-2 | D-1 | CL-1 | 0.57 | 96 | 79 | 5.5 | 15 | 97 | 4.6 |
| Example 22 | B | A-2 | B-8 | I-3 | D-1 | CL-1 | 0.57 | 95 | 77 | 5.5 | 15 | 97 | 4.6 |
| Example 23 | B | A-2 | B-8 | I-4 | D-1 | CL-1 | 0.57 | 94 | 76 | 5.4 | 15 | 97 | 4.7 |
| Example 24 | B | A-2 | B-8 | I-1 | D-3 | CL-1 | 0.42 | 98 | 80 | 5.1 | 15 | 97 | 4.3 |
| Example 25 | B | A-29 | B-8 | I-1 | D-4 | CL-1 | 0.46 | 92 | 72 | 5.1 | 15 | 93 | 4.2 |
| Example 26 | D | A-2 | B-8 | I-1 | D-1 | CL-1 | 0.57 | 105 | 88 | 5.7 | 15 | 97 | 4.5 |
| Comparative Example 5 | B | A'-1 | B-7 | I-1 | D-1 | CL-1 | 0.65 | 88 | 52 | 4.7 | 15 | 99 | 3.7 |
| Comparative Example 6 | B | A'-2 | B-7 | I-1 | D-1 | CL-1 | 0.74 | 68 | 37 | 4.3 | 15 | 99 | 3.2 |
| Comparative Example 7 | B | A'-3 | — | I-1 | D-1 | CL-1 | 0.47 | 85 | 67 | 4.8 | 80 | 86 | 3.7 |
| Comparative Example 8 | B | A'-4 | B-5 | I-1 | D-1 | CL-1 | 0.49 | 88 | 69 | 4.9 | 18 | 87 | 1.8 |
| Comparative Example 9 | B | A'-5 | B-5 | I-1 | D-1 | CL-1 | 0.49 | 87 | 68 | 4..8 | 18 | 85 | 1.7 |
| Comparative Example 10 | B | A'-6 | B-5 | I-1 | D-1 | CL-1 | 0.55 | 85 | 60 | 4.5 | 18 | 72 | 0.9 |
| Comparative Example 11 | B | A'-7 | B-5 | I-1 | D-1 | CL-1 | 0.50 | 87 | 67 | 4.8 | 18 | 87 | 1.8 |
| Comparative Example 12 | B | A-2 | B-8 | I-1 | D-1 | — | 0.57 | 88 | 69 | 2.0 | 15 | 97 | 1.4 |
| Comparative Example 13 | D | A'-1 | B-7 | I-1 | D-1 | CL-1 | 0.65 | 95 | 61 | 4.9 | 15 | 99 | 3.8 |

TABLE 3

| | Support | Compound represented by Formula 1 and Comparative compound Type of mother nucleus structure | Counter anion (Za) | Electron-accepting polymerization initiator | Electron-donating polymerization initiator | Acid color former | Printing durability Oil-based ink | UV ink | ΔL | On-press developability (sheets) | Aging stability Remaining rate (%) | ΔL |
|---|---|---|---|---|---|---|---|---|---|---|---|---|
| Example 27 | B | A-5 | B-7 | I-1 | D-1 | CL-1 | 95 | 74 | 5.6 | 15 | 97 | 4.5 |
| Example 28 | B | A-11 | B-7 | I-1 | D-1 | CL-1 | 96 | 76 | 5.7 | 15 | 95 | 4.6 |
| Example 29 | B | A-28 | B-7 | I-1 | D-1 | CL-1 | 94 | 77 | 5.6 | 15 | 95 | 4.6 |
| Example 30 | B | A-32 | B-7 | I-1 | D-1 | CL-1 | 92 | 77 | 5.8 | 15 | 97 | 4.8 |
| Example 31 | B | A-37 | B-7 | I-1 | D-1 | CL-1 | 92 | 74 | 5.4 | 15 | 96 | 4.7 |
| Example 32 | B | A-38 | B-7 | I-1 | D-1 | CL-1 | 93 | 75 | 5.4 | 15 | 98 | 4.6 |
| Example 33 | B | A-42 | B-7 | I-1 | D-1 | CL-1 | 93 | 76 | 5.3 | 15 | 95 | 4.6 |

The lithographic printing plate precursor according to the disclosure, of each of Examples 1 to 33, is favorable in all printing durability, color formability, on-press developability, and aging stability, with reference to the results described in Table 1 to Table 3. In this regard, it has been found that the lithographic printing plate precursor of each Comparative Example is inferior in at least any of printing durability or color formability.

The disclosure of Japanese Patent Application No. 2017-137249 filed on Jul. 13, 2017 is herein incorporated by reference in its entity.

All documents, patent applications, and technical standards described herein are herein incorporated by reference, as if each individual document, patent application, and technical standard were specifically and individually indicated to be incorporated by reference.

What is claimed is:

1. A method of preparing a lithographic printing plate, comprising imagewise exposing a lithographic printing plate precursor, thereby forming an exposed portion and an unexposed portion, and feeding at least one of printing ink or dampening water, thereby removing the unexposed portion, wherein the lithographic printing plate precursor comprises an image recording layer on a hydrophilic support, the image recording layer comprises a polymerization initiator, an infrared absorbent, a polymerizable compound, a polymer particle, and an acid color former, the infrared absorbent comprises a compound represented by the following Formula 1, and the difference between the highest occupied molecular orbital (HOMO) of the compound represented by Formula 1 and the highest occupied molecular orbital of the polymerization initiator is 0.57 eV or less:

Formula 1

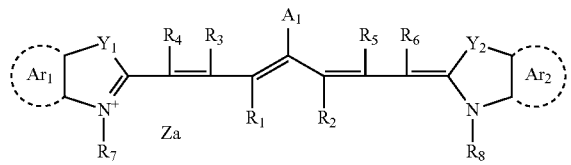

wherein $R_1$ and $R_2$ each independently represents a hydrogen atom or an alkyl group, $R_1$ and $R_2$ are optionally mutually linked to form a ring, $R_3$ to $R_6$ each independently represents a hydrogen atom or an alkyl group, $R_7$ and $R_8$ each independently represents an alkyl group or an aryl group, $Y_1$ and $Y_2$ each independently represents an oxygen atom, a sulfur atom, —$NR_0$— or a dialkylmethylene group, $R_0$ represents a hydrogen atom, an alkyl group, or an aryl group, $Ar_1$ and $Ar_2$ each independently represents a group that forms a benzene ring or a naphthalene ring optionally having —X described below, $A_1$ represents —$NR_9R_{10}$, —$X_1$-$L_1$, or —X described below, $R_9$ and $R_{10}$ each independently represent an alkyl group, an aryl group, an alkoxycarbonyl group, or an arylsulfonyl group, $X_1$ represents an oxygen atom or a sulfur atom, $L_1$ represents a hydrocarbon group, a heteroaryl group, or a group where a bond with $X_1$ is to be cleaved by heat or infrared exposure, Za represents a counter ion that neutralizes charge, and at least one of $Ar_1$ or $Ar_2$ has —X, X represents a halogen atom, —C(=O)—$X_2$—$R_{11}$, —C(=O)—$NR_{12}R_{13}$, —O—C(=O)—$R_{14}$, —CN, —$SO_2NR_{15}R_{16}$, or a perfluoroalkyl group, $X_2$ represents a single bond or an oxygen atom, $R_{11}$ and $R_{14}$ each independently represents an alkyl group or an aryl group, and $R_{12}$, $R_{13}$, $R_{15}$ and $R_{16}$ each independently represents a hydrogen atom, an alkyl group, or an aryl group.

2. A method of preparing a lithographic printing plate, comprising imagewise exposing a lithographic printing plate precursor, thereby forming an exposed portion and an unexposed portion, and at least one of printing ink or dampening water, thereby removing the unexposed portion, wherein the lithographic printing plate precursor comprises an image recording layer on a hydrophilic support, the image recording layer comprises a polymerization initiator, an infrared absorbent, a polymerizable compound, and an acid color former, the polymerization initiator comprises a tetraarylborate compound, the polymerizable compound comprises a urethane-based addition-polymerizable compound, the infrared absorbent comprises a compound represented by the following Formula 1, and the difference between the highest occupied molecular orbital (HOMO) of the compound represented by Formula 1, and the HOMO of the polymerization initiator is 0.57 eV or less;

Formula 1

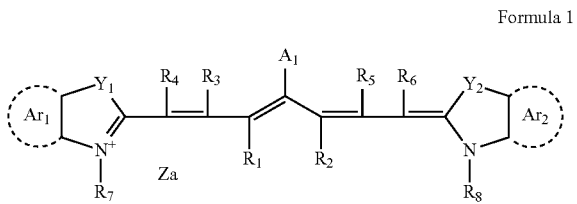

wherein $R_1$ and $R_2$ each independently represents a hydrogen atom or an alkyl group, $R_1$ and $R_2$ are optionally mutually linked to form a ring, $R_3$ to $R_6$ each independently represents a hydrogen atom or an alkyl group, $R_7$ and $R_8$ each independently represents an alkyl group or an aryl group, $Y_1$ and $Y_2$ each independently represents an oxygen atom, a sulfur atom, —$NR_0$— or a dialkylmethylene group, $R_0$ represents a hydrogen atom, an alkyl group, or an aryl group, $Ar_1$ and $Ar_2$ each independently represents a group that forms a benzene ring or a naphthalene ring optionally having —X described below, $A_1$ represents —$NR_9R_{10}$, —$X_1$-$L_1$, or —X described below, $R_9$ and $R_{10}$ each independently represent an alkyl group, an aryl group, an alkoxycarbonyl group, or an arylsulfonyl group, $X_1$ represents an oxygen atom or a sulfur atom, $L_1$ represents a hydrocarbon group, a heteroaryl group, or a group where a bond with $X_1$ is to be cleaved by heat or infrared exposure, Za represents a counter ion that neutralizes charge, and at least one of $Ar_1$ or $Ar_2$ has —X, X represents a halogen atom, —C(=O)—$X_2$—$R_{11}$, —C(=O)—$NR_{12}R_{13}$, —O—C(=O)—$R_{14}$, —CN, or —$SO_2NR_{15}R_{16}$, or a perfluoroalkyl group, $X_2$ represents a single bond or an oxygen atom, $R_{11}$ and $R_{14}$ each independently represents an alkyl group or an aryl group, and $R_{12}$, $R_{13}$, $R_{15}$ and $R_{16}$ each independently represents a hydrogen atom, an alkyl group, or an aryl group.

3. The method according to claim 1, wherein X represents a fluorine atom, a chlorine atom, or —C(=O)$OR_{17}$, provided that $R_{17}$ represents an alkyl group or an aryl group.

4. The method according to claim 1, wherein $A_1$ in Formula 1 represents —$NR_{18}R_{19}$ or —S—$R_{20}$, provided that $R^{18}$ and $R^{19}$ each independently represents an aryl group and $R_{20}$ represents a hydrocarbon group or a heteroaryl group.

5. The method according to claim 1, wherein the polymerization initiator is a borate compound.

6. The method according to claim 5, wherein the borate compound is a tetraarylborate compound or a monoalkyltriarylborate compound.

7. The method according to claim 1, wherein the polymerization initiator comprises an electron-donating polymerization initiator and an electron-accepting polymerization initiator.

8. The method according to claim 1, wherein the acid color former is at least one compound selected from the group consisting of a spirolactone compound and a spirolactam compound.

9. The method according to claim 1, wherein Za represents a carbon atom-containing organic anion.

10. The method according to claim 1, wherein Za represents a sulfonimide anion.

11. The method according to claim 1, wherein the polymerizable compound comprises an ester compound of unsaturated carboxylic acid.

12. The method according to claim 5, wherein the polymerizable compound comprises an ester compound of unsaturated carboxylic acid.

13. The method according to claim 1, wherein X represents a halogen atom, —C(=O)—$X_2$—$R_{11}$, —C(=O)—$NR_{12}R_{13}$, —O—C(=O)—$R_{14}$, —CN, or —$SO_2NR_{15}R_{16}$.

14. The method according to claim 1, wherein the difference between the HOMO of the compound represented by Formula 1 and the HOMO of the polymerization initiator is 0.45 eV or more.

15. The method according to claim 1, wherein, in Formula 1, Za represents a sulfonamide anion or a sulfonimide anion.

16. The method according to claim 2, wherein X represents a halogen atom, —C(=O)—$X_2$—$R_{11}$, —C(=O)—$NR_{12}R_{13}$, —O—C(=O)—$R_{14}$, —CN, or —$SO_2NR_{15}R_{16}$.

17. The method according to claim 2, wherein the image recording layer further comprises a polymer particle.

18. The method according to claim 2, wherein the difference between the HOMO of the compound represented by Formula 1 and the HOMO of the polymerization initiator is 0.45 eV or more.

19. The method according to claim 2, wherein, in Formula 1, Za represents a sulfonamide anion or a sulfonimide anion.

* * * * *